United States Patent
Yamamoto et al.

(10) Patent No.: US 7,789,988 B2
(45) Date of Patent: Sep. 7, 2010

(54) METHOD FOR SEPARATING PROTECTIVE TAPE, AND APPARATUS USING THE SAME

(75) Inventors: Masayuki Yamamoto, Osaka (JP); Takao Matsushita, Mie-ken (JP); Masaki Sakata, Mie-ken (JP)

(73) Assignee: Nitto Denko Corporation, Osaka (JP)

( * ) Notice: Subject to any disclaimer, the term of this patent is extended or adjusted under 35 U.S.C. 154(b) by 750 days.

(21) Appl. No.: 11/723,239

(22) Filed: Mar. 19, 2007

(65) Prior Publication Data

US 2007/0284038 A1    Dec. 13, 2007

(30) Foreign Application Priority Data

Apr. 18, 2006   (JP)   ............... 2006-114766
Jul. 26, 2006    (JP)   ............... 2006-203651

(51) Int. Cl.
*B29C 65/50* (2006.01)
*B32B 38/10* (2006.01)
*B32B 43/00* (2006.01)

(52) U.S. Cl. ...................... 156/247; 156/344
(58) Field of Classification Search ........... 156/247, 156/267, 344, 379.8, 510, 540, 589
See application file for complete search history.

(56) References Cited

U.S. PATENT DOCUMENTS 7,060,154 B2 *   6/2006   Yamamoto et al. .......... 156/267

FOREIGN PATENT DOCUMENTS

| JP | 02125440 A | * | 5/1990 |
| JP | 05-063077 | | 3/1993 |
| JP | 2002124494 A | * | 4/2002 |

OTHER PUBLICATIONS

English Abstract of JP 02-125440.*

* cited by examiner

*Primary Examiner*—Philip C Tucker
*Assistant Examiner*—Sing P Chan
(74) *Attorney, Agent, or Firm*—Cheng Law Group, PLLC

(57) ABSTRACT

A peripheral edge of a protective tape joined to a front face of a semiconductor wafer is snagged on a needle having a sharp tip end so as to be partially separated from the front face of the semiconductor wafer; thus, a separated portion is formed. Next, an operation of joining a separating tape to a surface of the protective tape is started from the separated portion, and the protective tape is separated together with the separating tape from the front face of the semiconductor wafer with the separated portion as a starting end.

15 Claims, 15 Drawing Sheets

METHOD FOR SEPARATING PROTECTIVE TAPE, AND APPARATUS USING THE SAME

BACKGROUND OF THE INVENTION (1) Field of the Invention

The present invention relates to a method for separating a protective tape, and an apparatus using the same. In this method, a separating adhesive tape is joined to a surface of a protective tape joined to a front face of a semiconductor wafer in such a manner that a joining member presses the separating adhesive tape against the protective tape, and then the protective tape is separated together with the separating adhesive tape from the front face of the semiconductor wafer.

(2) Description of the Related Art

In order to make a semiconductor wafer (hereinafter, simply referred to as a "wafer") thin, there is adopted a mechanical method such as grinding or polishing or a chemical method such as etching. When a wafer is subjected to processing by such method, a protective tape is joined to a front face thereof in order to protect a wiring pattern formed on the front face. The wafer is subjected to polishing with the protective tape joined thereto, and then is held by a ring-shaped frame in such a manner that a supporting viscous tape is joined to a back face thereof. Thereafter, the protective tape is separated and removed from the front face of the wafer held by the ring-shaped frame.

For example, JP-A 05-063077 (1993) discloses a method for separation and removal of a protective tape. Herein, a separating adhesive tape is joined to a surface of a protective tape joined to a front face of a wafer by means of a joining member such as a roller or an edge member, and then is separated and removed together with the protective tape from the front face of the wafer while being reeled.

However, the aforementioned conventional method has the following problems.

That is, if the protective tape joined to the wafer has a high adhesion property, it is difficult to form a folded portion, serving as a starting point of separation of the protective tape, at a peripheral edge of the wafer even when the separating adhesive tape is joined to the protective tape. Consequently, the protective tape cannot be separated from the wafer.

In addition, the protective tape cut in a protective tape cutting step has a trapezoidal sectional shape (that is, an adhesive face of the protective tape becomes longer in width than a surface thereof). Consequently, adhesion between the separating adhesive tape and the peripheral edge of the wafer is hardly achieved, so that a separating stress is hardly applied to the separating adhesive tape upon separation of the separating adhesive tape, resulting in poor separation accuracy.

SUMMARY OF THE INVENTION

The present invention is devised in view of the aforementioned circumstances. A principal object of the present invention is to provide a method for separation of a protective tape and an apparatus using the same each having the following advantage. That is, it is possible to separate a protective tape joined to a front face of a semiconductor wafer from the semiconductor wafer with good accuracy in such a manner that a separating adhesive tape is joined to the protective tape, and then is separated together with the protective tape from the front face of the semiconductor wafer.

In order to accomplish the aforementioned object, the present invention adopts the following various configurations.

First, the present invention provides a method for joining a separating adhesive tape to a protective tape joined to a front face of a semiconductor wafer in such a manner that a joining member presses the separating adhesive tape against the protective tape to separate the protective tape together with the separating adhesive tape from the front face of the semiconductor wafer, the method comprising: a first separation step of snagging a peripheral edge of the protective tape on a separation member having a sharp tip end so as to at least partially separate the peripheral edge of the protective tape from the front face of the semiconductor wafer; a joining step of retreating the separation member by which the peripheral edge of the protective tape is separated from the front face of the semiconductor wafer, allowing the joining member to press the separating adhesive tape against the protective tape, and allowing the semiconductor wafer and the joining member to relatively move in a plane direction of the protective tape so as to join the separating adhesive tape to the protective tape; and a second separation step of allowing the semiconductor wafer and the joining member to relatively move in the plane direction of the protective tape with the separated peripheral edge as a starting point so as to separate the protective tape together with the separating adhesive tape from the front face of the semiconductor wafer.

According to the first method of the present invention, a peripheral edge of a protective tape joined to a front face of a semiconductor wafer (hereinafter, simply referred to as a "wafer") is snagged on a separation member having a sharp tip end. Thus, the peripheral edge of the protective tape is partially separated from the front face of the wafer. Thereafter, a separating adhesive tape joined to a surface of the protective tape is separated together with the protective tape from the front face of the wafer with the separated portion of the protective tape as a starting point. That is, an adhesion strength to the wafer is reduced at the separated portion; therefore, a starting point of separation of the protective tape can be formed when a separating stress is concentrated on the separated portion. Thus, the protective tape can be separated from the front face of the wafer with certainty.

Second, the present invention provides a method for joining a separating adhesive tape to a protective tape joined to a front face of a semiconductor wafer in such a manner that a joining member presses the separating adhesive tape against the protective tape to separate the protective tape together with the separating adhesive tape from the front face of the semiconductor wafer, the method comprising: a first separation step of sticking a separation member having a sharp tip end in a peripheral edge of the protective tape so as to partially separate the peripheral edge of the protective tape from the front face of the semiconductor wafer; a joining step of retreating the separation member by which the peripheral edge of the protective tape is separated from the front face of the semiconductor wafer, allowing the joining member to press the separating adhesive tape against the protective tape, and allowing the semiconductor wafer and the joining member to relatively move in a plane direction of the protective tape so as to join the separating adhesive tape to the protective tape; and a second separation step of allowing the semiconductor wafer and the joining member to relatively move in the plane direction of the protective tape with the separated peripheral edge as a starting point so as to separate the protective tape together with the separating adhesive tape from the front face of the semiconductor wafer.

According to the second method of the present invention, a peripheral edge of a protective tape joined to a front face of a wafer is stuck with a separation member having a sharp tip end. Thus, the peripheral edge of the protective tape is partially separated from the front face of the wafer. Thereafter, a separating adhesive tape joined to a surface of the protective tape is separated together with the protective tape from the front face of the wafer with the separated portion of the protective tape as a starting point. That is, an adhesion strength to the wafer is reduced at the separated portion; therefore, a starting point of separation of the protective tape can be formed when a separating stress is concentrated on the separated portion. Thus, the protective tape can be separated from the front face of the wafer with certainty.

Third, the present invention provides a method for joining a separating adhesive tape to a protective tape joined to a front face of a semiconductor wafer in such a manner that a joining member presses the separating adhesive tape against the protective tape to separate the protective tape together with the separating adhesive tape from the front face of the semiconductor wafer, the method comprising: a first separation step of sticking a separation member having a sharp tip end in the protective tape so as to at least partially separate a peripheral edge of the protective tape from the front face of the semiconductor wafer; a step of allowing the tip end of the separation member to be situated in the vicinity of the separated peripheral edge of the protective tape externally from a peripheral edge of the semiconductor wafer; a joining step of allowing the joining member to start to press the separating adhesive tape against the protective tape from the separated peripheral edge of the protective tape, and allowing the semiconductor wafer and the joining member to relatively move in a plane direction of the protective tape so as to join the separating adhesive tape to the protective tape; and a second separation step of allowing the semiconductor wafer and the joining member to relatively move in the plane direction of the protective tape with the separated peripheral edge as a starting point so as to separate the protective tape together with the separating adhesive tape from the front face of the semiconductor wafer.

According to the third method of the present invention, a peripheral edge of a protective tape joined to a front face of a wafer is stuck with a separation member having a sharp tip end. Thus, the peripheral edge of the protective tape is partially separated from the front face of the wafer. After the separation of the peripheral edge, the tip end of the separation member is situated in the vicinity of an end of the separated portion of the protective tape externally from a peripheral edge of the wafer. Thereafter, an operation of joining a separating adhesive tape to the protective tape is started from the separated portion of the protective tape.

Herein, the tip end of the separation member is situated in the vicinity of a protective tape separation start end. Therefore, even in a case that the separating adhesive tape to be joined to the protective tape is excessively unreeled, protrudes from the outer periphery of the wafer and drops onto a wafer holding face of a member for holding the wafer, the tip end of the separation member receives the dropped separating adhesive tape. After the operation of joining the separating adhesive tape, the separating adhesive tape is separated together with the protective tape from the front face of the wafer with the separated portion as a starting point. That is, an adhesion strength to the wafer is reduced at the separated portion; therefore, a starting point of separation of the protective tape can be formed when a separating stress is concentrated on the separated portion. Thus, the protective tape can be separated together with the separating adhesive tape from the front face of the wafer with certainty.

Moreover, even in the case that the separating adhesive tape protruding from the outer periphery of the wafer drops onto the wafer holding face, the tip end of the separation member can receive the dropped separating adhesive tape. Therefore, it is possible to prevent a viscous face of the separating adhesive tape from coming into contact with the wafer holding face. For example, in a case that a protective tape is separated by a separating adhesive tape from a front face of a wafer on a mount frame held at a center of a ring frame with a viscous tape, it is possible to prevent a viscous face of the viscous tape from coming into contact with that of the separating adhesive tape. In addition, the wafer is applied with no excessive separating stress upon separation of the protective tape; therefore, it is possible to prevent the wafer from being damaged.

In the first to third methods of the present invention, preferably, in the joining step, a pressing force for joining the separating adhesive tape is made weak at the peripheral edge of the protective tape separated in the first separation step in comparison with the other portion of the protective tape.

With this configuration, when a separating adhesive tape is joined to a surface of a protective tape, it is possible to prevent a separated portion of the protective tape from being joined to a front face of a wafer again. Accordingly, it is possible to separate the protective tape from the front face of the wafer with good accuracy with the separated portion as a starting point.

In the first to third methods of the present invention, preferably, the joining step and the second separation step are carried out concurrently.

Specifically, a separating adhesive tape wound around a joining member comes into contact with an end edge of a protective tape while being pressed against the end edge of the protective tape. Thereafter, the wafer and the joining member relatively move in a plane direction of the protective tape. At a contact portion of the joining member with the wafer, the operation of joining the separating adhesive tape and the operation of separating the separating adhesive tape are performed concurrently. The protective tape is successively separated from the front face of the wafer with the end edge, from which the operation of joining the separating adhesive tape is started, as a starting point.

In the first to third methods of the present invention, preferably, in the first separation step, the semiconductor wafer and the separation member are relatively moved in the plane direction of the protective tape so as to be away from each other, and in the second separation step, the semiconductor wafer and the joining member are relatively moved in the plane direction of the protective tape so as to be away from each other with the separated portion as a starting point.

With this configuration, it is possible to suitably implement each of the first to third methods of the present invention.

In the first and second methods of the present invention, for example, the separation member is a needle, and the joining member is an edge member having a sharp tip end.

With this configuration, an optional point of a peripheral edge of a protective tape is snagged on a tip end of a needle; thus, a separating stress can be concentrated on such point. Alternatively, the peripheral edge of the protective tape is stuck with the needle; thus, the separating stress can be concentrated on the stuck portion. In other words, the peripheral edge of the protective tape can be partially separated from a front face of a wafer with certainty. When an edge member is used for joining a separating adhesive tape, the separating adhesive tape comes into contact with the protective tape in a small-width linear shape. Therefore, it is possible to readily set a joining position.

In the third method of the present invention, for example, the separation member is a comb-shaped member including a plurality of needles.

With this configuration, it is possible to receive a dropped separating adhesive tape with certainty.

In order to accomplish the aforementioned object, the present invention also adopts the following configuration.

The present invention provides an apparatus for joining a separating adhesive tape to a protective tape joined to a front face of a semiconductor wafer to separate the protective tape together with the separating adhesive tape from the front face of the semiconductor wafer, the apparatus comprising: holding means for holding the semiconductor wafer with the protective tape placed thereon; a separation member having a sharp tip end directed to the protective tape joined to the front face of the semiconductor wafer; first lift drive means for allowing the separation member to vertically move, relative to the holding means, between an acting position where one of a peripheral edge of the protective tape joined to the semiconductor wafer held by the holding means and a peripheral edge of the semiconductor wafer is stuck with the tip end of the separation member and a standby position located above the acting position; separating adhesive tape supply means for supplying a strip-shaped separating adhesive tape to the joining member so as to wind the separating adhesive tape around the joining member; second lift drive means for allowing the joining member to vertically move, relative to the holding member, between an acting position where the separating adhesive tape is joined to a surface of the protective tape joined to the semiconductor wafer held by the holding means and a standby position located above the acting position; horizontal drive means for allowing the holding means and the separating member to relatively and horizontally move so as to be away from each other and allowing the holding means and the joining member to relatively and horizontally move so as to be away from each other; control means for controlling the horizontal drive means such that the separation member and the holding means each situated at the acting position relatively move so as to be away from each other to partially separate the peripheral edge of the protective tape from the front face of the protective tape, controlling the first lift drive means such that the separation member retreats into the standby position, controlling the second lift drive means such that the joining member moves to the acting position, and controlling the horizontal drive means such that the joining member and the holding means relatively move so as to be away from each other to separate the protective tape from the front face of the semiconductor wafer while joining the separating adhesive tape to the protective tape; and tape collection means for collecting the separated protective tape integrated with the separating adhesive tape.

According to the apparatus of the present invention, a separation member and holding means each situated at an acting position are moved relatively so as to be away from each other. Thus, a peripheral edge of a protective tape can be partially separated from a front face of a wafer. Thereafter, a separating adhesive tape joined to a surface of the protective tape is separated together with the protective tape from the front face of the wafer with the separated portion as a starting point. Thus, it is possible to suitably implement each of the first to third methods of the present invention.

Preferably, when the separating adhesive tape is joined to the protective tape, the control means controls the second lift drive means such that a distance between the holding means and the joining member is made long at the peripheral edge of the protective tape separated by the separation means in comparison with the other portion of the protective tape.

With this configuration, a pressing force applied to a separated portion of a protective tape can be weakened upon performance of an operation of joining a separating adhesive tape. Thus, it is possible to prevent the separated portion of the protective tape from being joined to a front face of a wafer again.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

With reference to the drawings, hereinafter, description will be given of a semiconductor wafer mount apparatus equipped with a protective tape separation apparatus according to the present invention.

Figure 1:
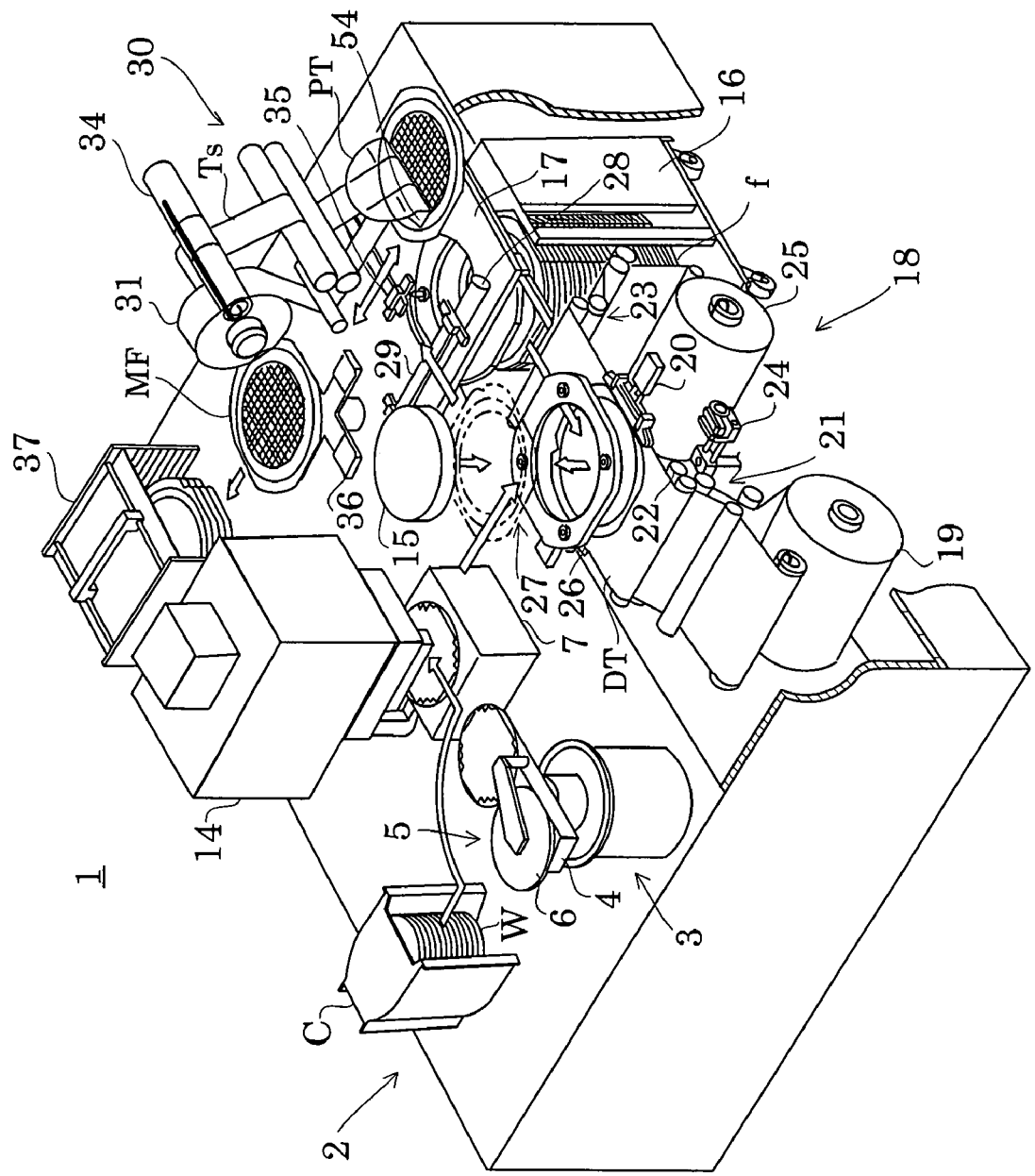
FIG. 1 is a perspective view illustrating a general configuration of a semiconductor wafer mount apparatus.

FIG. 1 is a partially broken perspective view illustrating a general configuration of the semiconductor wafer mount apparatus.

The semiconductor wafer mount apparatus 1 includes a wafer supply section 2, a wafer transport mechanism 3, an alignment stage 7, an ultraviolet-ray irradiation unit 14, a chuck table 15, a ring frame supply section 16, a ring frame transport mechanism 17, a tape processing section 18, a ring frame lift mechanism 26, a mount frame preparation section 27, a first mount frame transport mechanism 29, a separation mechanism 30, a second mount frame transport mechanism 35, a turn table 36 and a mount frame collection section 37.

Specifically, the wafer supply section 2 includes a cassette C housing a stack of semiconductor wafers (hereinafter, simply referred to as "wafers") W each subjected to back grinding. The wafer transport mechanism 3 includes a robot arm 4 and a pressing mechanism 5. The alignment stage 7 performs alignment on a wafer W. The ultraviolet-ray irradiation unit 14 irradiates a wafer W placed on the alignment stage 7 with ultraviolet rays. The chuck table 15 suction holds a wafer W. The ring frame supply section 16 houses a stack of ring frames f. The ring frame transport mechanism 17 transfers a ring frame f to a supporting viscous tape DT serving as a dicing tape. The tape processing section 18 joins a supporting viscous tape DT to a bottom side of a ring frame f. The ring frame lift mechanism 26 allows a ring frame f having a supporting viscous tape DT joined thereto to move upward/downward. The mount frame preparation section 27 prepares a mount frame MF having a configuration that a ring frame f and a wafer W are joined to each other with a supporting viscous tape DT joined to the ring frame f. The first mount frame transport mechanism 29 performs transport of a mount frame MF. The separation mechanism 30 separates a protective tape PT from a front face of a wafer W. The second mount frame transport mechanism 35 performs transport of a mount frame MF from which a protective tape PT is separated by the separation mechanism 30. The turn table 36 changes a direction of a mount frame MF and performs transport of the mount frame MF. The mount frame collection section 37 houses a stack of mount frames MF.

The wafer supply section 2 is provided with a cassette bench (not illustrated). The cassette C is placed on the cassette bench, and houses a stack of wafers W each having a patterned face (hereinafter, appropriately referred to as a "front face") to which a protective tape PT is joined. Herein, each wafer W is in a horizontal position while a patterned face thereof is directed upward.

The wafer transport mechanism 3 is turned and is moved upward/downward by a drive mechanism (not illustrated). More specifically, the wafer transport mechanism 3 controls a position of a wafer holding part (to be described later) of the robot arm 4 and a position of a pressing plate 6 (to be described later) of the pressing mechanism 5, and transports a wafer W from the cassette C to the alignment stage 7.

The wafer holding part (not illustrated) is formed into a horse-shoe shape and is provided at a tip end of the robot arm 4 of the wafer transport mechanism 3. In addition, the wafer holding part of the robot arm 4 can be inserted between wafers W housed in the cassette C. Herein, the wafer holding part of the robot arm 4 has a suction hole, and vacuum sucks a back face of a wafer W to thereby hold the wafer W.

The pressing plate 6 is formed into a circular shape substantially equal to that of a wafer W and is provided at a tip end of the pressing mechanism 5 of the wafer transport mechanism 3. The pressing plate 6 has a movable arm so as to move above a wafer W placed on the alignment stage 7. The shape of the pressing plate 6 is not limited to a circular shape as long as it can correct warpage of a wafer W. For example, a tip end of a rod-shaped member may be pressed against such warpage of a wafer W.

The pressing mechanism 5 is actuated in a case that suction failure occurs at a wafer W placed on a holding table (to be described later) of the alignment stage 7. More specifically, if the holding table of the alignment stage 7 fails to suction hold a wafer W due to warpage, the pressing plate 6 is pressed against a front face of the wafer W in order to correct such warpage. In other words, the pressing plate 6 is used for flattening a wafer W. After the correction of warpage, the holding table vacuum sucks a back face of the wafer W.

The holding table of the alignment stage 7 performs alignment on a wafer W placed thereon, on the basis of an orientation flat or a notch formed at a peripheral edge of the wafer W, and then vacuum sucks an entire back face of the wafer W.

The alignment stage 7 detects a value of a pressure applied when vacuum sucking a wafer W. Then, the alignment stage 7 compares a reference value previously determined in regard to a pressure value in a normal operation (i.e., when the holding table normally vacuum sucks a wafer W) with a measured value as a result of the detection. If the measured value is higher than the reference value (i.e., if a pressure in an intake tube is not lowered sufficiently), the alignment stage 7 determines that the holding table fails to vacuum suck a wafer W due to warpage. Then, the pressing plate 6 is pressed against the wafer W to thereby correct such warpage. Thus, the holding table enables to vacuum suck the wafer W.

The alignment stage 7 is movable between an initial position where a wafer W is placed thereon and is subjected to alignment and an intermediate position which is located between the chuck table 15 provided above the tape processing section 18 (to be described later) and the ring frame lift mechanism 26, while suction holding a wafer W. That is, the alignment stage 7 corrects warpage of a wafer W, and then transports the flattened wafer W to a subsequent step.

The ultraviolet-ray irradiation unit 14 is situated above the alignment stage 7 in the initial position. The ultraviolet-ray irradiation unit 14 irradiates, with ultraviolet rays, a protective tape PT which is a UV curable viscous tape joined to a front face of a wafer W. In other words, the ultraviolet-ray irradiation unit 14 lowers adhesion of a protective tape PT by irradiation with ultraviolet rays.

The chuck table 15 is formed into a circular shape substantially equal to a shape of a wafer W in order to vacuum suck an entire front face of the wafer W. In addition, the chuck table 15 is movable upward/downward between a standby position located above the tape processing section 18 and a position where a wafer W is joined to a ring frame f, by means of a drive mechanism (not illustrated).

That is, the chuck table 15 comes into contact with a wafer W, which is corrected as for warpage and is flattened by the holding table, and vacuum sucks the wafer W.

The chuck table 15 is contained in an opening of the ring frame lift mechanism 26 for suction holding a ring frame f having a bottom side to which a supporting viscous tape DT (to be described later) is joined. That is, a wafer W is moved downward so as to be situated in the vicinity of a supporting viscous tape DT located at a center of a ring frame f.

Herein, the chuck table 15 and the ring frame lift mechanism 26 are held by a holding mechanism (not illustrated).

The ring frame supply section 16 is of a wagon type, and has wheels provided at a bottom side thereof. Further, the ring frame supply section 16 is contained in the semiconductor wafer mount apparatus 1, and has an opened top side from which stacked ring frames f housed therein are successively supplied while being slid upward.

The ring frame transport mechanism 17 vacuum sucks ring frames f housed in the ring frame supply section 16 one by one from above. Thereafter, the ring frames f are successively transported to an alignment stage (not illustrated) and, then, to a position where a supporting viscous tape DT is joined thereto. When a supporting viscous tape DT is joined to a ring frame f, the ring frame transport mechanism 17 also serves as a holding mechanism which holds the ring frame f at a position where the supporting viscous tape DT is joined to the ring frame f.

The tape processing section 18 includes a tape supply section 19 supplying a supporting viscous tape DT to a ring frame f, a tensioning mechanism 20 applying a tension to the supporting viscous tape DT, a joining unit 21 joining the supporting viscous tape DT to the ring frame f, a cutter mechanism 24 cutting the supporting viscous tape DT joined to the ring frame f, a removal unit 23 removing an unnecessary portion of the supporting viscous tape DT cut by the cutter mechanism 24 from the ring frame f, and a tape collection section 25 collecting the unnecessary portion of the supporting viscous tape DT.

The tensioning mechanism 20 applies a tension to a supporting viscous tape DT in a width direction in such a manner that the supporting viscous tape DT is pulled at both ends thereof in the width direction. In a case of using a soft supporting viscous tape DT, vertical wrinkles occur at a surface of the supporting viscous tape DT along a tape supplying direction due to a tension applied in the tape supplying direction. In order to prevent occurrence of such vertical wrinkle, when a tension is applied to the supporting viscous tape DT in the width direction, the supporting viscous tape DT can be uniformly joined to a ring frame f.

The joining unit 21 is situated at a standby position located obliquely downward of a ring frame f held above a supporting viscous tape DT (an obliquely lower left portion in FIG. 1). The joining unit 21 includes a joining roller 22. When the ring frame transport mechanism 17 transports a ring frame f to a supporting viscous tape joining position and the tape supply section 19 starts to supply a supporting viscous tape DT toward the ring frame f, concurrently, the joining roller 22 moves to a joining operation start position located at a right end in the tape supplying direction.

After arrival at the joining operation start position, the joining roller 22 moves upward to thereby press the supporting viscous tape DT against the ring frame f. Then, the joining roller 22 rolls on the supporting viscous tape DT from the joining operation start position toward a standby position; thus, the supporting viscous tape DT is joined to the ring frame f.

The removal unit 23 removes an unnecessary portion of a supporting viscous tape DT cut by the cutter mechanism 24 (to be described later) from a ring frame f. More specifically, after completion of an operation of joining a supporting viscous tape DT to a ring frame f and cut of the supporting viscous tape DT, the tensioning mechanism 20 releases the supporting viscous tape DT. Then, the removal unit 23 moves toward the tape supply section 19 over the ring frame f, and removes an unnecessary portion of the supporting viscous tape DT from the ring frame f.

The cutter mechanism 24 is situated downward a supporting viscous tape DT joined to a ring frame f. When the joining unit 21 joins a supporting viscous tape DT to a ring frame f, the tensioning mechanism 20 releases the supporting viscous tape DT. Thereafter, the cutter mechanism 24 moves upward, and then cuts the supporting viscous tape DT along the ring frame f.

The ring frame lift mechanism 26 is situated at a standby position located above a position where a supporting viscous tape DT is joined to a ring frame f. After completion of the operation of joining the supporting viscous tape DT to the ring frame f, the ring frame lift mechanism 26 moves downward, and then suction holds the ring frame f. Herein, the ring frame transport mechanism 17 holding the ring frame f before completion of the joining operation returns to an initial position located above the ring frame supply section 16.

The ring frame lift mechanism 26 suction holding the ring frame f moves upward to a joining position where the ring frame f is joined to a wafer W. Herein, the chuck table 15 suction holding the wafer W moves downward to the joining position.

The mount frame preparation section 27 includes a joining roller 28 having a circumferential face which is elastically deformed. The joining roller 28 rolls on a non-adhesive face of a supporting viscous tape DT while pressing the supporting viscous tape DT against a bottom side of a ring frame f.

The first mount frame transport mechanism 29 vacuum sucks a mount frame MF including a ring frame f and a wafer W integrated with each other, and then transfers the mount frame MF to a separation table (not illustrated) of the separation mechanism 30.

Figure 2:
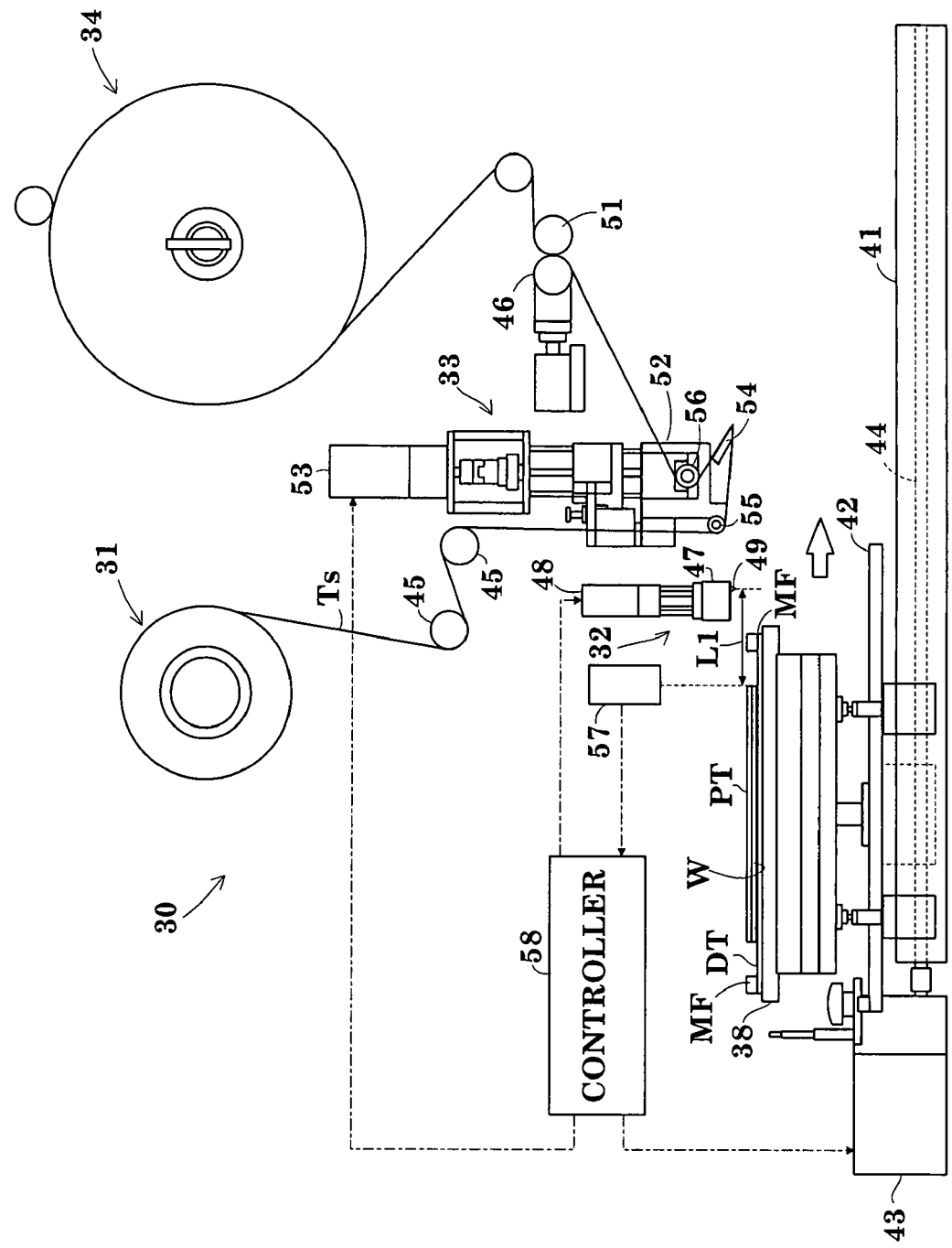
FIG. 2 is a side view illustrating a separation mechanism according to a first embodiment of the present invention.

As illustrated in FIG. 2, the separation mechanism 30 includes a separation table 38, a tape supply section 31, a first separation unit 32, a second separation unit 33 and a tape collection section 34. Herein, the separation table 38 performs transport of a wafer W placed thereon. The tape supply section 31 performs supply of a separating adhesive tape (hereinafter, simply referred to as a "separating tape") Ts. The first separation unit 32 partially separates a peripheral edge of a protective tape PT from a front face of a wafer W. The second separation unit 33 performs a joining operation and a separating operation for a separating tape Ts. The tape collection section 34 collects a separating tape Ts together with a protective tape PT. Herein, the constituent elements of the separation mechanism 30 are fixedly provided in the semiconductor wafer mount apparatus 1, except the separation table 38.

It is to be noted that the separation table 38 corresponds to holding means according to the present invention, the tape supply section 31 corresponds to separating adhesive tape supply means according to the present invention, a separating tape Ts corresponds to a separating adhesive tape according to the present invention. Examples of the separating adhesive tape may include a thermosetting adhesive tape, a pressure-sensitive adhesive tape set by application of heat or irradiation with ultraviolet rays, a thermoplastic adhesive tape, and the like. Further, such adhesive tape may be replaced with a viscous tape.

The separation table 38 vacuum sucks a bottom side of a mount frame MF, and is supported on a movable bench 42 which slidably moves forward/rearward along a pair of rails 41 provided in parallel with each other. The movable bench 42 is driven by a screw shaft 44 rotated in a forward/backward direction by a pulse motor 43. It is to be noted that the rails 41, the movable bench 42, the pulse motor 43, the screw shaft 44 and the like correspond to horizontal drive means according to the present invention.

The tape supply section 31 guides and supplies a separating tape Ts derived from a roll to lower ends of the first and second separation units 32 and 33 through a guide roller 45.

The tape collection section 34 reels and collects a separating tape Ts fed from the lower ends of the first and second separation units 32 and 33 so as to guide the separating tape Ts upward through a feed roller 46 driven by a motor and a guide roller 51.

The first separation unit 32 includes a movable block 47, a pulse motor 48 and a needle 49. The movable block 47 is movable upward/downward by a screw shaft rotated by the pulse motor 48. The needle 49 having a sharp tip end serves as a separation member for a separating tape Ts and is provided at a lower end of the movable block 47. The needle 49 protruding from the lower end of the movable block 47 has a length shorter than a thickness of a protective tape PT. That is, even when a bottom side of the movable block 47 comes into contact with a surface of a protective tape PT, the tip end of the needle 49 does not come into contact with a front face of a wafer W. It is to be noted that the movable block 47, the pulse motor 48 and the like correspond to first lift drive means according to the present invention.

The second separation unit 33 includes a movable block 52, a pulse motor 53, an edge member 54, a receiving guide roller 55 and a feeding guide roller 56. The movable block 52 is movable upward/downward by a screw shaft rotated by the pulse motor 53. The edge member 54 having a sharp tip end serves as a joining and separating member for a separating tape Ts and is provided at a lower end of the movable block 52. The receiving guide roller 55 guides a supplied separating tape Ts toward the tip end of the edge member 54. The feeding guide roller 56 guides a separating tape Ts folded back at the tip end of the edge member 54 toward the tape collection section 34. The edge member 54 is made of a plate material having a width longer than a diameter of a wafer W, and is fixedly attached in such a posture that the tip end thereof is directed obliquely downward. It is to be noted that the movable block 52, the pulse motor 53 and the like correspond to second lift drive means according to the present invention.

The first separation unit 32 also includes a reflection-type optical sensor 57 corresponding to detection means for detecting an end edge of a protective tape PT in a non-contact manner at a position located forward the needle 49 in a separating tape joining direction. The optical sensor 57 emits a laser beam at a predetermined wavelength toward a surface of a protective tape PT at a position spaced forward away from the tip end of the needle 49 by a predetermined distance L1, and then receives a laser beam reflected from the surface of the protective tape PT. The optical sensor 57 transmits information about such detection to a controller 58. On the basis of the received information, the controller 58 controls actuation of the pulse motor 43 for allowing the separation table 38 to move forward/rearward and, also, controls actuation of the pulse motors 48 and 53 for allowing the needle 49 and the edge member 54 to move upward/downward. A wavelength and an output of a laser beam emitted from the optical sensor 57 are variable depending on a type and a thickness of a protective tape PT to be used. In this embodiment, for example, a laser beam is of a shorter wavelength in a range from 0.6 to 1 µm. It is to be noted that the controller 58 corresponds to control means according to the present invention.

The second mount frame transport mechanism 35 vacuum sucks a mount frame MF supplied from the separation mechanism 30, and then transfers the mount frame MF to the turn table 36.

The turn table 36 performs alignment on a mount frame MF, and then the mount frame collection section 37 houses the mount frame MF. More specifically, a mount frame MF is placed on the turn table 36 by the second mount frame transport mechanism 35, and then is subjected to alignment on the basis of an orientation flat of a wafer W or a position of a ring frame f. The turn table 36 is turnable in order to change a direction that the mount frame collection section 37 houses a mount frame MF. When the turn table 36 determines such direction, a mount frame MF is pushed by a pusher (not illustrated), and then is housed in the mount frame collection section 37.

The mount frame collection section 37 is placed on a placement table (not illustrated) which is movable upward/downward. That is, when the placement table moves upward/downward, a mount frame MF pushed by the pusher can be housed in an any stage of the mount frame collection section 37.

With reference to FIGS. 1 to 13, next, description will be given of a series of operations performed by the semiconductor wafer mount apparatus 1 according to this embodiment.

The wafer holding part of the robot arm 4 is inserted between wafers W housed in the cassette C, suction holds a wafer W from below, and takes the wafer W out of the cassette C. The robot arm 4 transports the wafer W to the alignment stage 7.

The wafer W is placed on the holding table by the robot arm 4, and then is suction held from below by the holding table. Herein, a pressure gauge (not illustrated) detects a suction level of the wafer W, and compares the detected level with a predetermined reference value in regard to a pressure value in a normal operation.

If the wafer W is suction held abnormally, the pressing plate 6 is pressed against a front face of the wafer W. Thus, the wafer W is suction held normally while being flattened (i.e., warpage of the wafer W is corrected). Herein, the wafer W is subjected to alignment on the basis of an orientation flat or a notch thereof.

After the alignment by the alignment stage 7, the ultraviolet-ray irradiation unit 14 irradiates the front face of the wafer W with ultraviolet rays.

The alignment stage 7 moves toward the mount frame preparation section 27 in such a state that the wafer W irradiated with ultraviolet rays is suction held by the holding table. That is, the alignment stage 7 moves to an intermediate position between the chuck table 15 and the ring frame lift mechanism 26.

When the alignment stage 7 is situated at a predetermined position on standby, the chuck table 15 situated above the alignment stage 7 moves downward. Thus, a bottom side of the chuck table 15 comes into contact with the wafer W, and the chuck table 15 starts to vacuum suck the wafer W. When the chuck table 15 starts to vacuum suck the wafer W, the holding table releases the wafer W. Thus, the wafer W is received by the chuck table 15 while being flattened (i.e., warpage of the wafer W is corrected). Thereafter, the alignment stage 7 returns to its initial position.

Next, one of stacked ring frames f housed in the ring frame supply section 16 is taken out of the ring frame supply section 16 while being vacuum sucked from above by the ring frame transport mechanism 17. The ring frame f is subjected to alignment at an alignment stage (not illustrated), and then is transported to a supporting viscous tape joining position located above a supporting viscous tape DT.

When the ring frame transport mechanism 17 transports the ring frame f to the supporting viscous tape joining position, the tape supply section 19 starts to supply a supporting viscous tape DT. Concurrently, the joining roller 22 moves to a joining operation start position.

When the joining roller 22 arrives at the joining operation start position, the tensioning mechanism 20 holds both ends of the supporting viscous tape DT in a width direction and applies a tension to the supporting viscous tape DT in the width direction.

Then, the joining roller 22 moves upward in order to join the supporting viscous tape DT to an end of the ring frame f while pressing the supporting viscous tape DT against the end of the ring frame f. Then, the joining roller 22 rolls on a non-adhesive face of the supporting viscous tape DT toward the tape supply section 19. That is, the joining roller 22 returns to its standby position. Thus, the supporting viscous tape DT is joined to the ring frame f. When the joining roller 22 arrives at its standby position, the tensioning mechanism 20 releases the supporting viscous tape DT.

Concurrently, the cutter mechanism 24 moves upward, and cuts the supporting viscous tape DT along the ring frame f. After the cut of the supporting viscous tape DT, the removal unit 23 moves toward the tape supply section 19 and removes an unnecessary portion of the supporting viscous tape DT from the ring frame f.

Then, the tape supply section 19 is actuated to unreel the supporting viscous tape DT therefrom, and the unnecessary portion of the cut supporting viscous tape DT is fed to the tape collection section 25. Herein, the joining roller 22 moves to the joining operation start position in order to join the supporting viscous tape DT to a next ring frame f.

The ring frame f having the supporting viscous tape DT joined thereto is moved upward in such a manner that the ring frame lift mechanism 26 moves upward while suction holding a frame side of the ring frame f. Herein, the chuck table 15 moves downward. That is, each of the chuck table 15 and the ring frame lift mechanism 26 moves to a position where the ring frame f and the wafer W are joined to each other.

At the predetermined position, each of the chuck table 15 and the ring frame lift mechanism 26 is held by a holding mechanism (not illustrated). Next, the joining roller 28 moves to a supporting viscous tape joining operation start position. Herein, the joining roller 28 rolls on a non-adhesive face of the supporting viscous tape DT joined to the bottom side of the ring frame f to join the supporting viscous tape DT to the wafer W. Thus, the ring frame f is joined to the wafer W with the supporting viscous tape DT to prepare a mount frame MF.

After the preparation of the mount frame MF, the chuck table 15 and the ring frame lift mechanism 26 move upward, respectively. Herein, a holding table (not illustrated) moves below the mount frame MF, so that the mount frame MF is placed on the holding table. Then, the first mount frame transport mechanism 29 suction holds the mount frame MF placed on the holding table, and transfers the mount frame MF to the separation table 38.

As illustrated in FIG. 2, the separation table 38 having the mount frame MF placed thereon moves forward to a portion located below the first separation unit 32. Herein, the optical sensor 57 measures a change in intensity of a laser beam emitted therefrom downward in a vertical direction and reflected from the protective tape PT or a time difference of return time. On the basis of a result of the measurement, the controller 58 discriminates a surface height of the protective tape PT from a viscous face of the supporting viscous tape DT bared between the ring frame f and the wafer W. Thus, a front end edge of the protective tape PT is detected.

Herein, the controller 58 previously stores a position of the separation table 38 from driving conditions of the pulse motor 43 on the basis of a distance L1 between the optical sensor 57 and tip end of the needle 49. Further, the controller 58 previously stores an acting position P1 where the movable block 47 moves downward and a predetermined distance L2 at which a peripheral edge of a protective tape PT is partially separated from a front face of wafer W with the acting position P1 as a starting point, on the basis of the distance L1.

Herein, the distance L2 is appropriately changed depending on a type and a thickness of a protective tape PT to be used.

Figure 3:
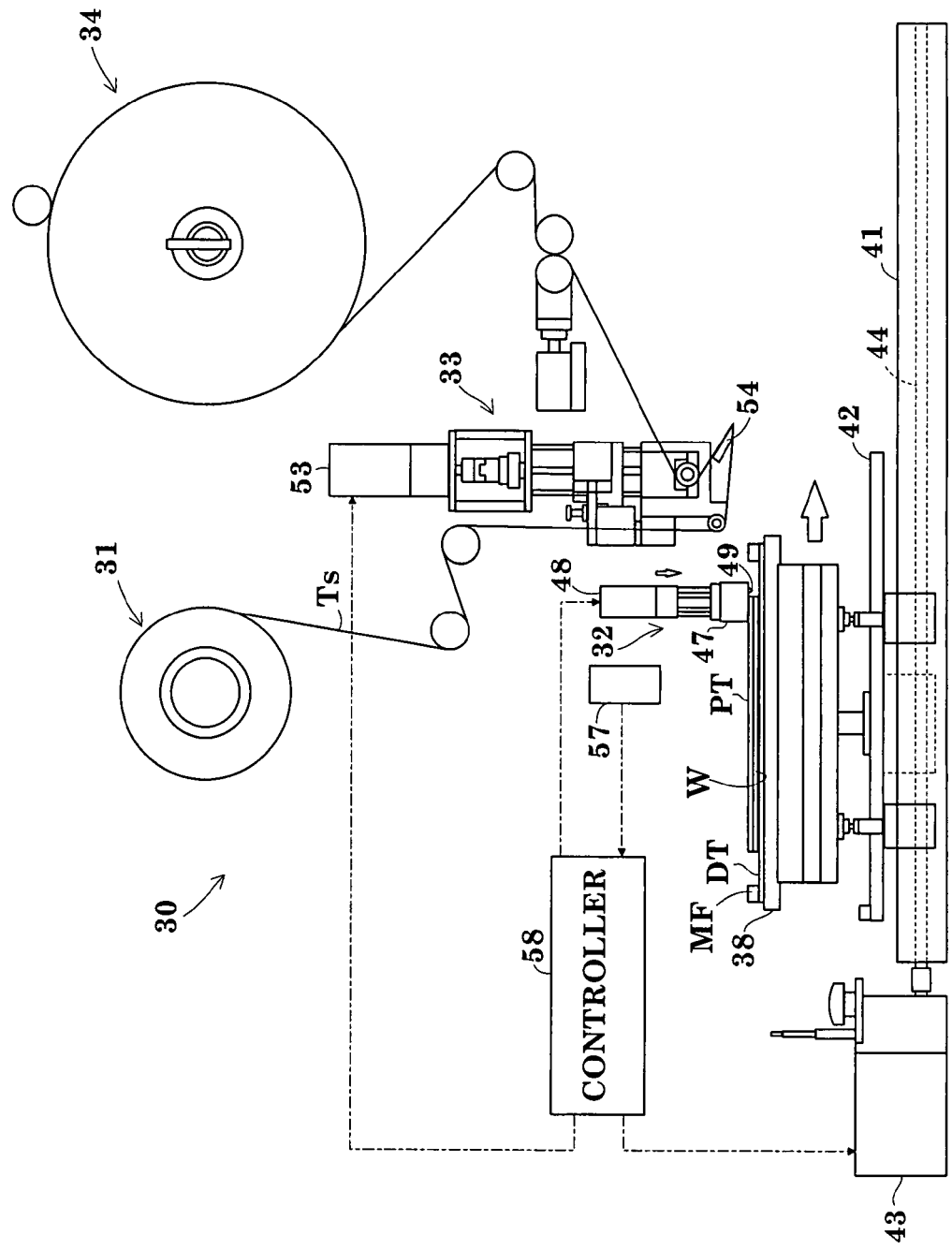
FIG. 3 is a side view illustrating an operation of the separation mechanism according to the first embodiment.
Figure 4:
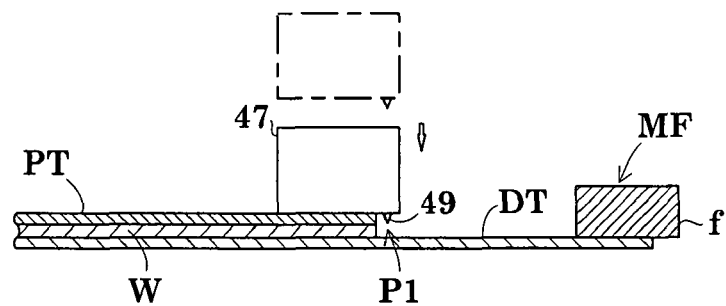
FIG. 4 is a side view illustrating an operation of the separation mechanism according to the first embodiment.
Figure 8:
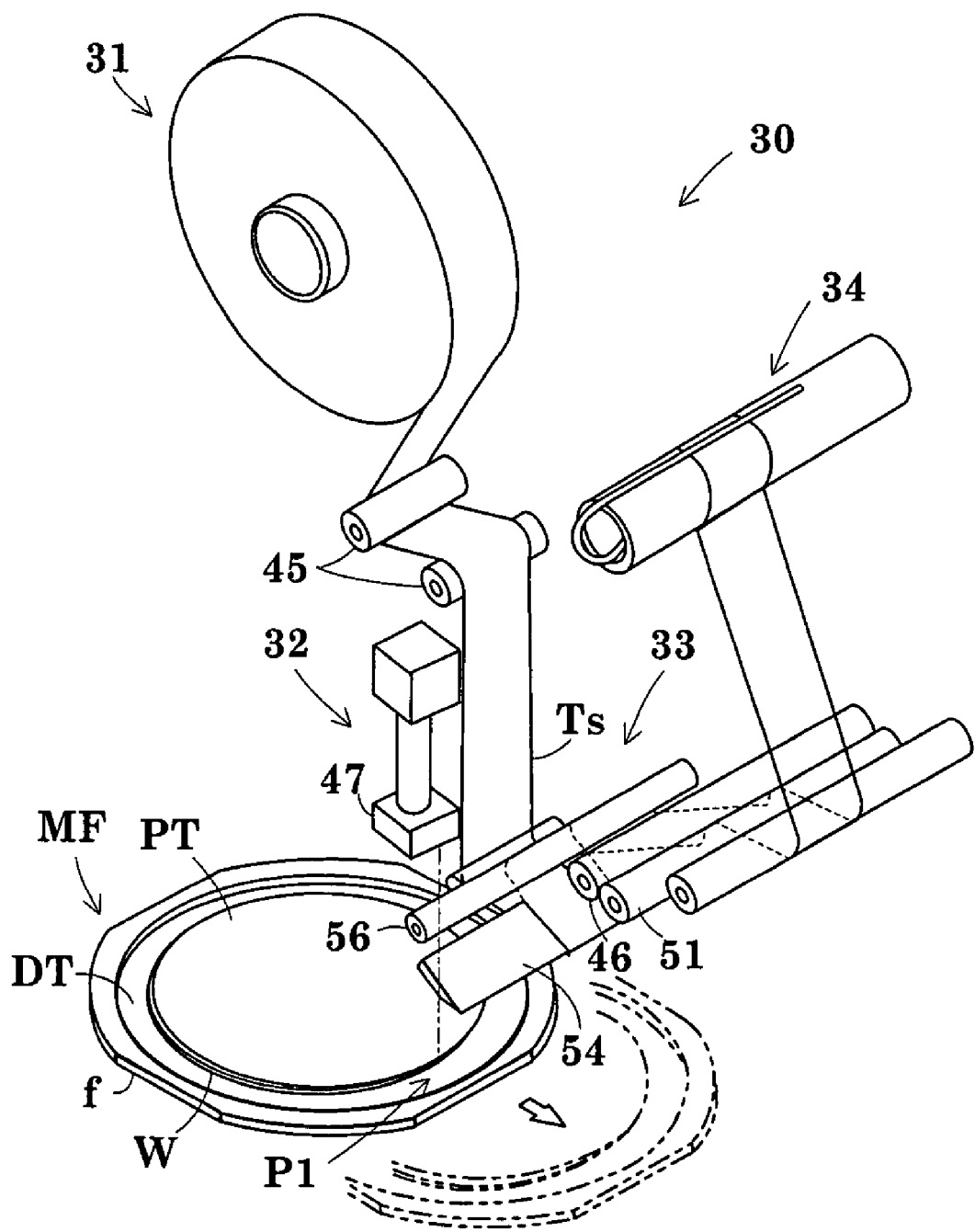
FIG. 8 is a perspective view illustrating an operation of the separation mechanism according to the first embodiment.

The controller 58 controls actuation of the pulse motor 43 on the basis of information about each of the distances L1 and L2 such that the separation table 38 moves forward from the detected position. Then, as illustrated in FIG. 8, the controller 58 halts the forward motion of the separation table 38 when the separation table 38 arrives at the acting position P1. Next, as illustrated in FIGS. 3 and 4, the controller 58 controls actuation of the pulse motor 48 such that the movable block 47 is situated at a predetermined height.

The controller 58 stops the actuation of the pulse motor 48 when the movable block 47 is situated at the predetermined height. At the predetermined height, the bottom side of the movable block 47 partially comes into contact with the surface of the protective tape PT (see a left side in the figure) and the tip end of the needle 49 does not exceed the thickness of the protective tape PT.

Figure 5:
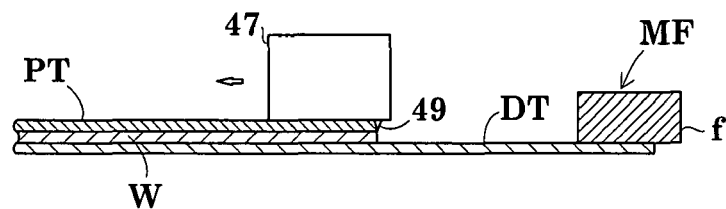
FIG. 5 is an enlarged side view mainly illustrating a separating operation of a first separation unit.
Figure 6:
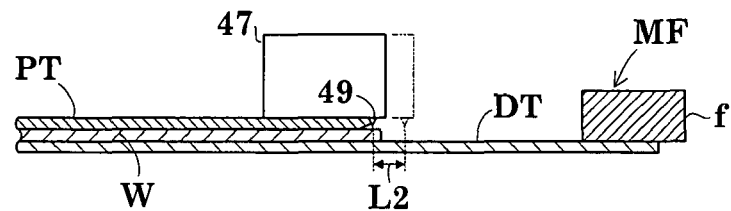
FIG. 6 is an enlarged side view mainly illustrating a separating operation of the first separation unit.
Figure 7:
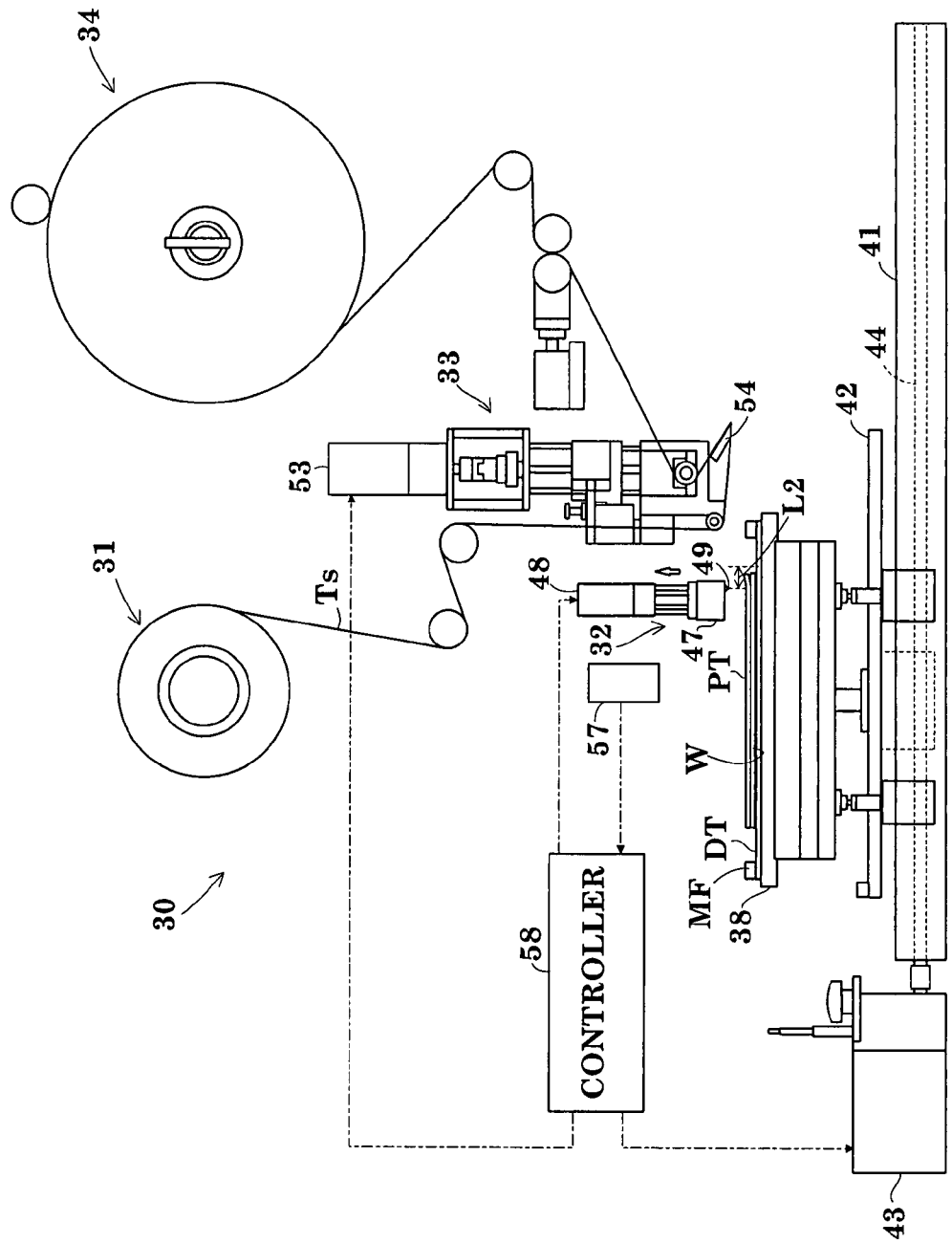
FIG. 7 is an enlarged side view mainly illustrating a separating operation of the first separation unit.

Then, the controller 58 controls the actuation of the pulse motor 43 such that the separation table 38 moves only by the predetermined distance L2. Herein, as illustrated in FIGS. 5 and 6, a peripheral edge of the protective tape PT is snagged on the tip end of the needle 49 and is partially separated from the front face of the wafer W. When the separation table 38 finishes to move by the distance D2, the controller 58 halts the actuation of the pulse motor 43 and actuates the pulse motor 48 such that the movable block 47 moves upward as illustrated in FIG. 7. Thus, the first separation unit 32 returns to its standby position.

Figure 9:
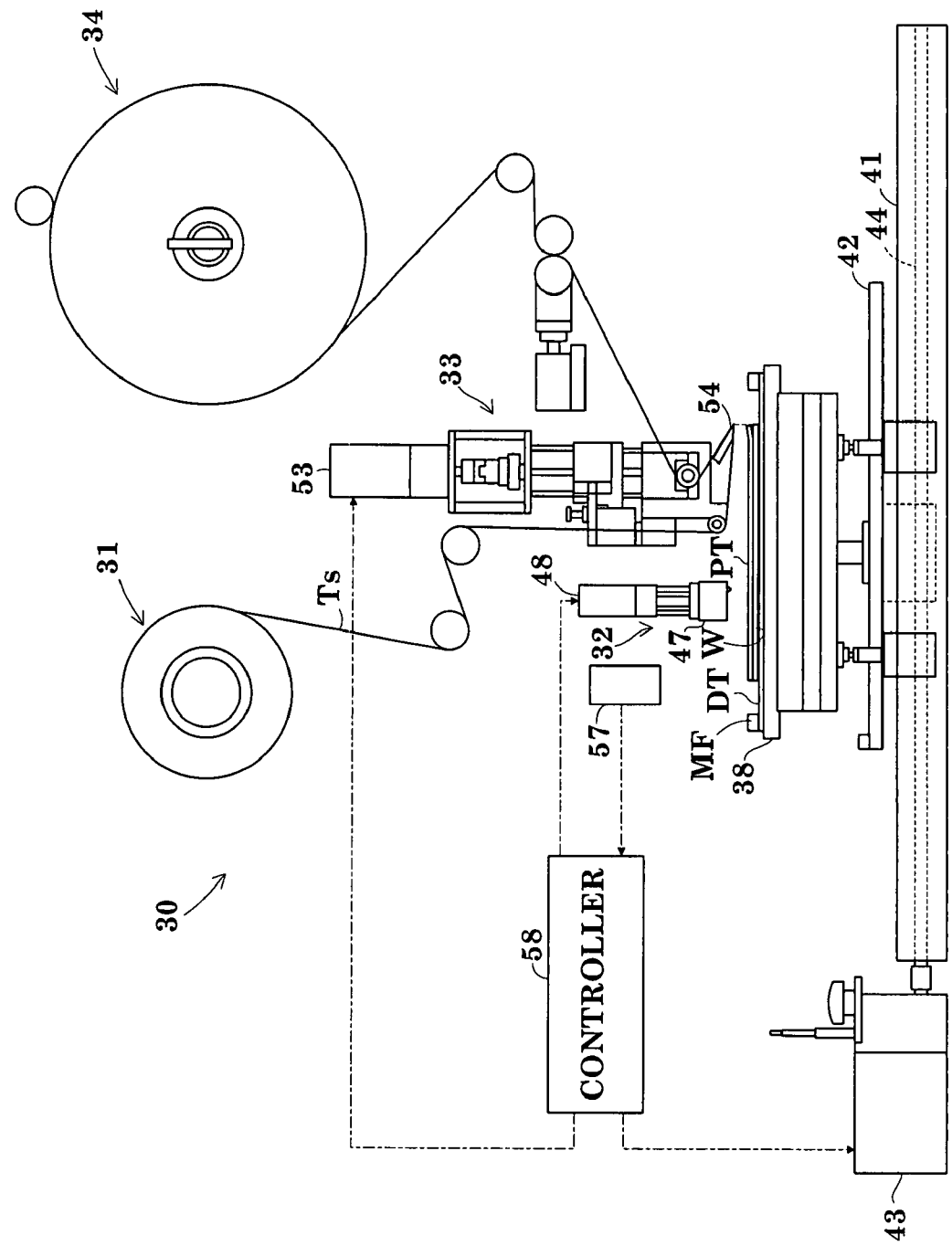
FIG. 9 is a perspective view illustrating a general configuration of the separation mechanism according to the first embodiment.

When the movable block 47 arrives at its retreat position, the controller 58 stops the pulse motor 48 and actuates the pulse motor 43 such that the separation table 38 moves forward as illustrated in FIG. 9. Herein, the controller 58 performs arithmetic processing to obtain a distance from the current position of the separation table 38 to the tip end of the edge member 54 from positional information of the separation table 38 previously detected by the optical sensor 57. Accordingly, the controller 58 controls the actuation of the pulse motor 43 such that the separation table 38 moves forward, and halts the forward motion of the separation table 38 at the detected position. That is, when the front end edge of the protective tape PT arrives at a position located immediately below the tip end of the edge member 54, the forward motion of the separation table 38 is halted automatically.

Figure 10:
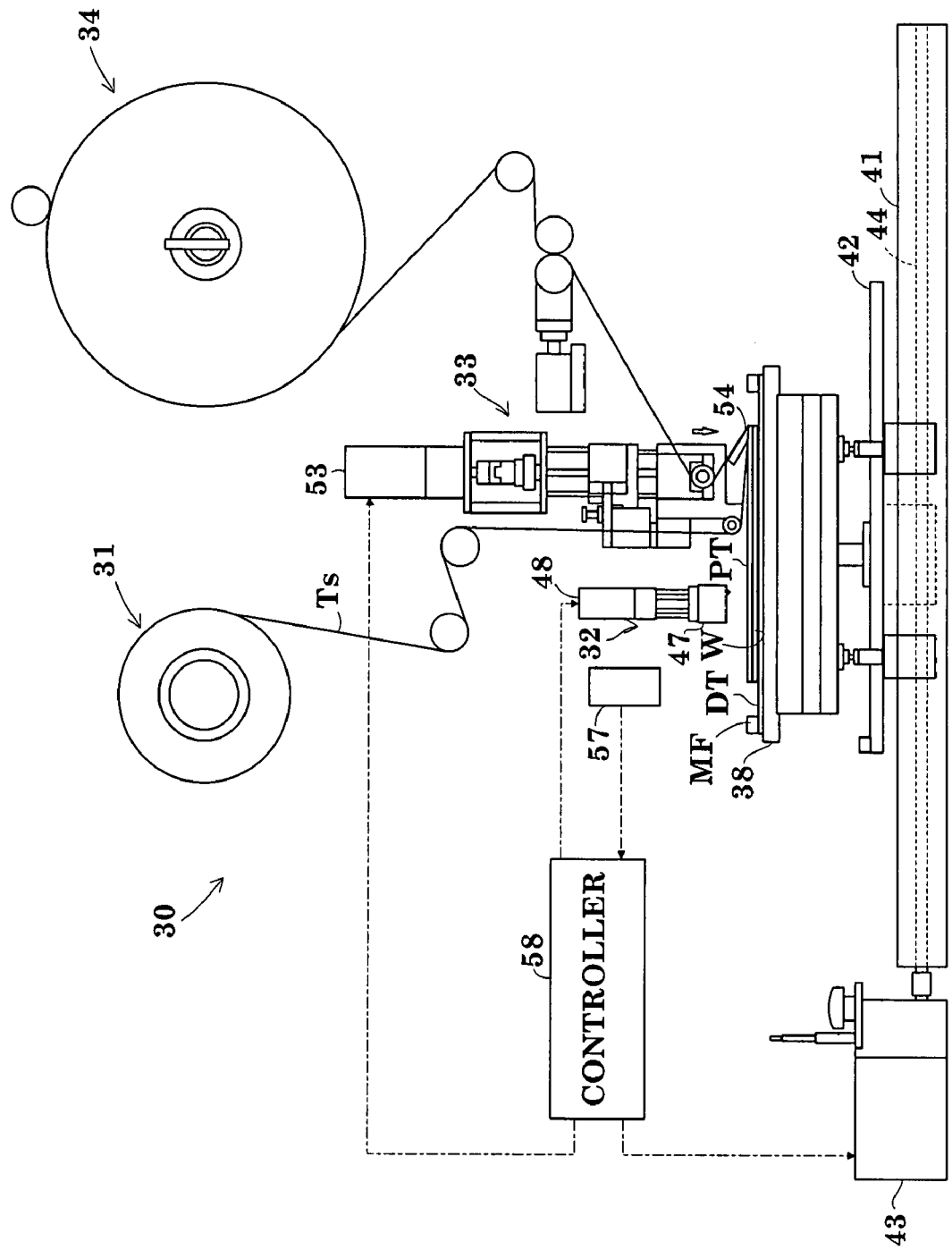
FIG. 10 is a perspective view illustrating an operation of the separation mechanism according to the first embodiment.
Figure 12:
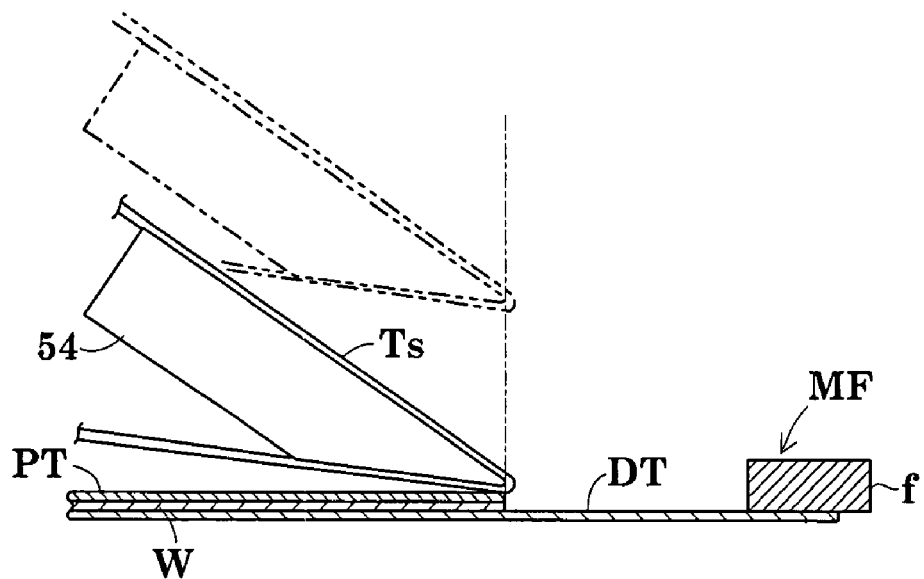
FIG. 12 is an enlarged side view mainly illustrating a joining operation and a separating operation of a second separation unit.

When the separation table 38 is halted, as illustrated in FIG. 10, the controller 58 controls actuation of the pulse motor 53 such that the movable block 52 moves downward. More specifically, the edge member 54 is moved downward such that a separating tape Ts supplied from the tape supply section 31 is wound therearound. Then, as illustrated in FIG. 12, the tip end of the edge member 54 presses the separating tape Ts against the separated portion of the protective tape PT by a predetermined pressing force; thus, the separating tape Ts is joined to the separated portion of the protective tape PT.

Figure 11:
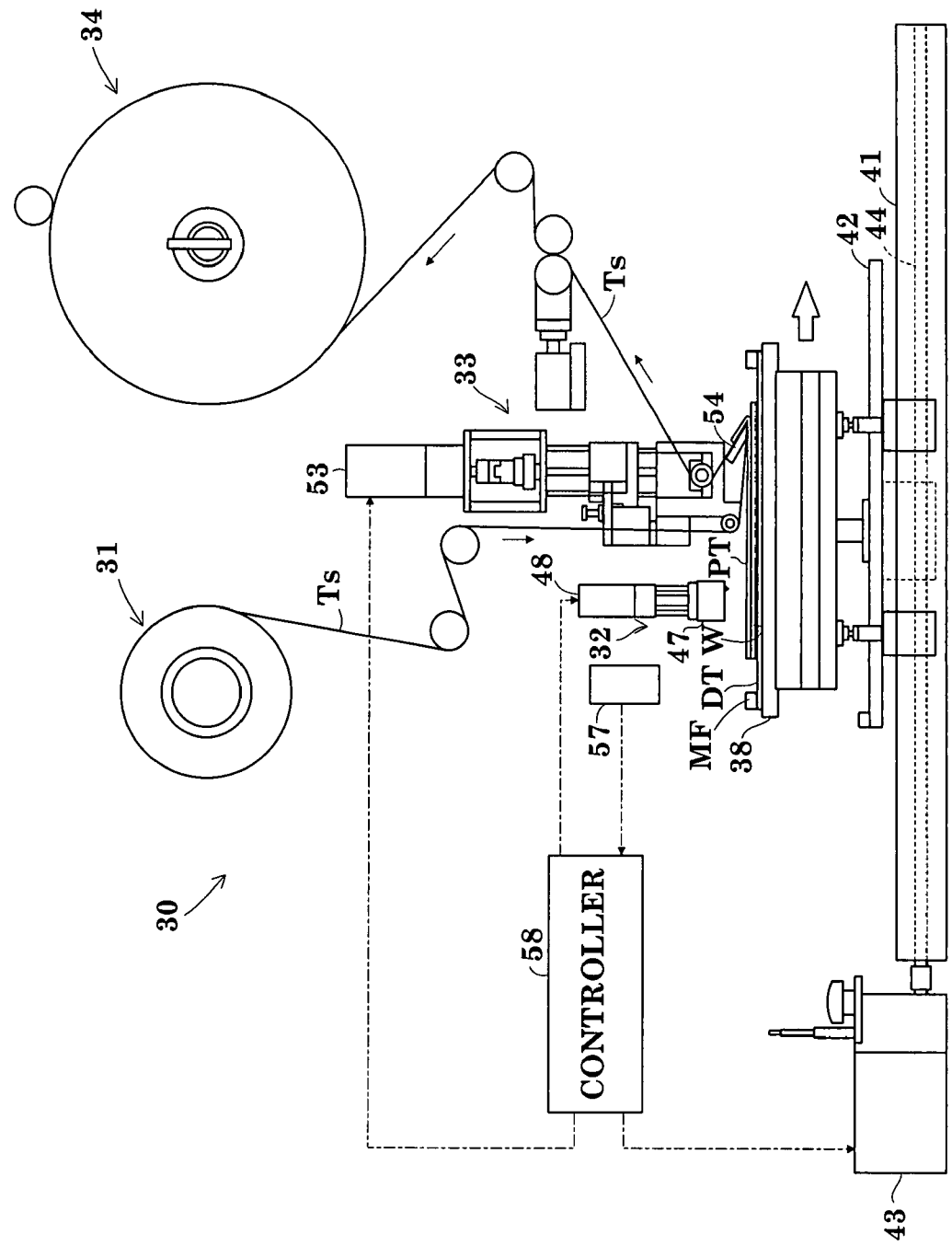
FIG. 11 is a perspective view illustrating an operation of the separation mechanism according to the first embodiment.
Figure 13:
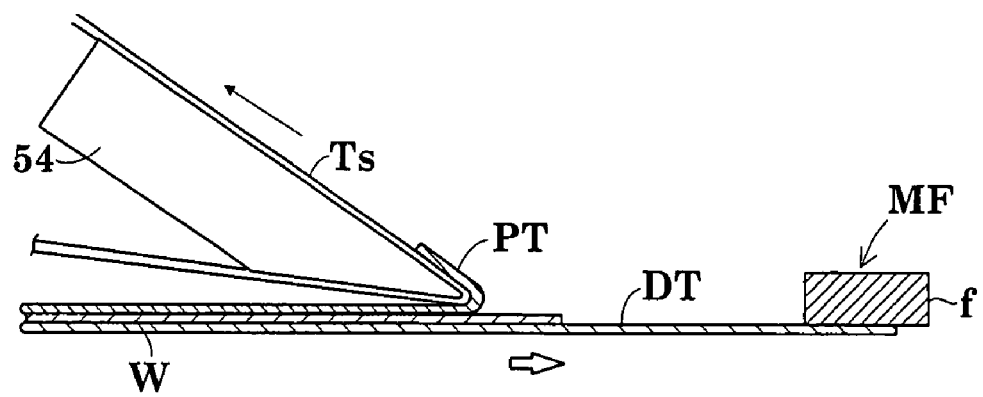
FIG. 13 is an enlarged side view mainly illustrating a joining operation and a separating operation of the second separation unit.

After performance of the operation of joining the separating tape Ts to the front end of the protective tape PT, as illustrated in FIGS. 11 and 13, the separation table 38 moves forward again while the edge member 54 presses the separating tape Ts against the protective tape PT. Herein, the tape collection section 34 reels the separating tape Ts at a speed synchronous with a moving speed of the separation table 38. Thus, the edge member 54 joins the separating tape Ts to the protective tape PT joined to the front face of the wafer W while pressing the separating tape Ts against the protective tape PT. Concurrently, the edge member 54 separates the protective tape PT together with the separating tape Ts from the front face of the wafer W.

At the point in time that the pulse motor 43 is actuated such that the edge member 54 moves forward from the separating tape joining operation start position by a distance corresponding to the diameter of the wafer W, in other word, at the point in time that the edge member 54 arrives at a rear end edge of the protective tape PT and the protective tape PT is completely separated from the front face of the wafer W, the edge member 54 is moved upward and the second separation unit 33 returns to its initial position.

The separation table 38 transfers the mount frame MF from which the wafer W is separated to the standby position of the second mount frame transport mechanism 35.

The second mount frame transport mechanism 35 receives the mount frame MF from the separation table 38, and then transfers the mount frame MF to the turn table 36. The mount frame MF placed on the turn table 36 is subjected to alignment on the basis of an orientation flat or a notch and is subjected to adjustment for a housing direction. After the alignment and the adjustment, the mount frame MF is pushed by the pusher and is housed in the mount frame collection section 37.

As described above, the peripheral edge of the protective tape PT is partially separated from the front face of the wafer W by the tip end of the needle 49 to form a separated portion and, then, the operation of joining the separating tape Ts to the surface of the protective tape PT is started from the separated portion. Thus, the protective tape PT can be separated together with the separating tape Ts with certainty, with the separated portion as a starting point.

Next, description will be given of a second embodiment of the present invention. This embodiment is different from the first embodiment in the configuration of the needle 49. Therefore, the other constituent elements in this embodiment are denoted by identical symbols of those in the first embodiment, and detailed description thereof will not be given here.

Figure 14:
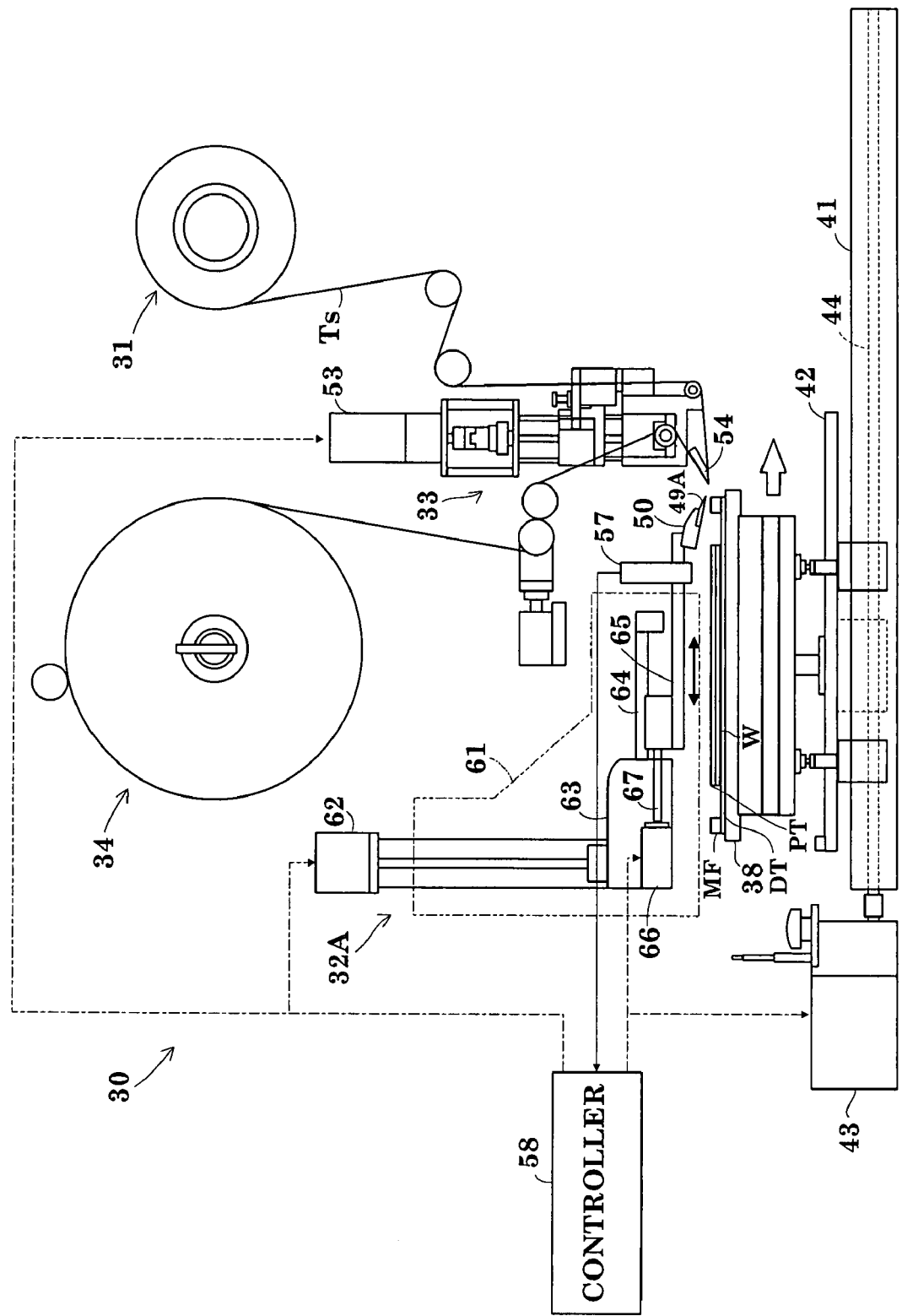
FIG. 14 is a side view illustrating a separation mechanism according to a second embodiment of the present invention.
Figure 15:
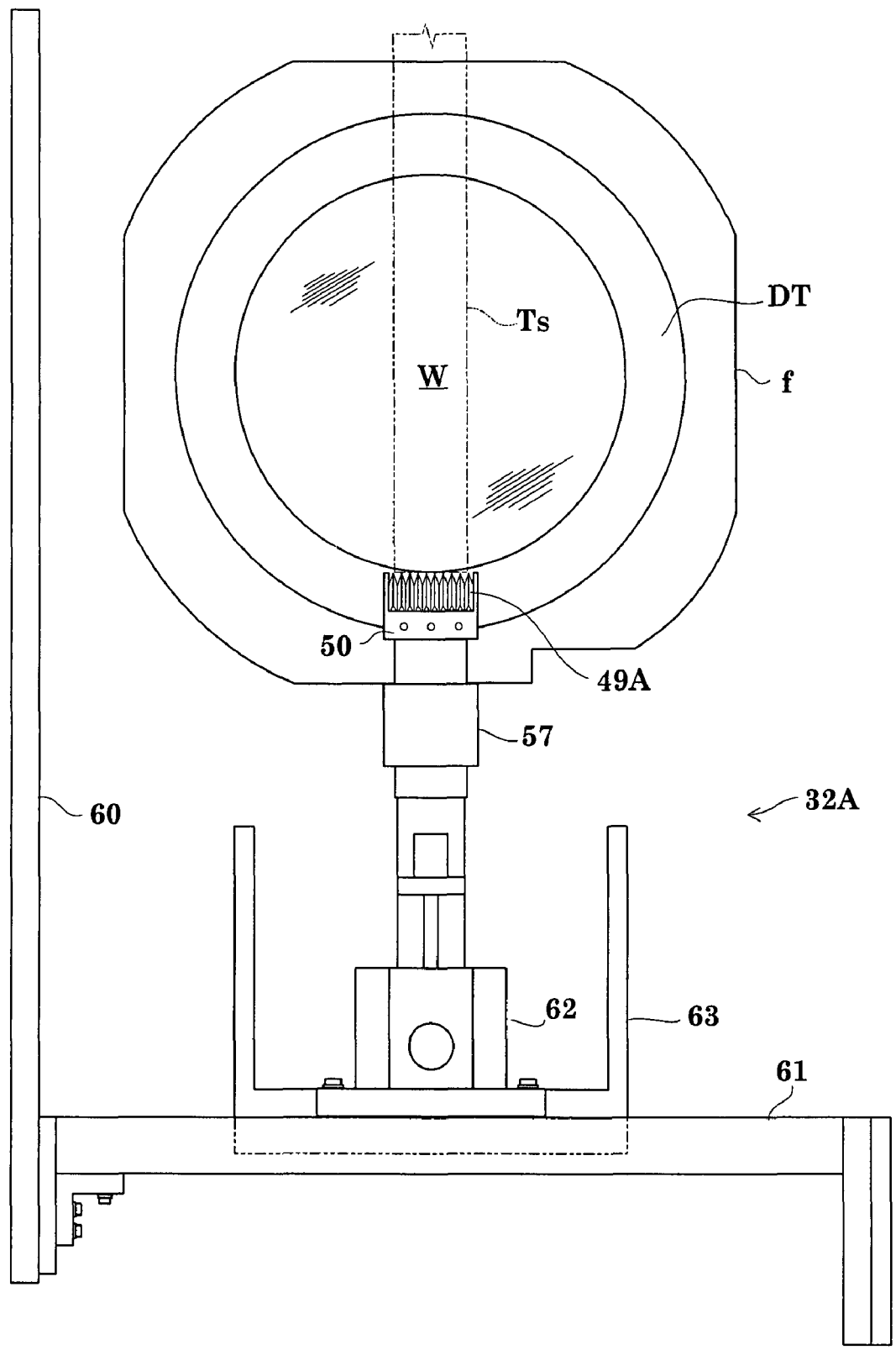
FIG. 15 is a plan view illustrating the separation mechanism according to the second embodiment.

As illustrated in FIGS. 14 and 15, a first separation unit 32A is fixedly attached to a vertical wall 60 of a semiconductor wafer mount apparatus 1 with an outer frame 61 interposed therebetween, and is provided in an inner frame 63 moved upward/downward by a screw shaft rotated in a forward/backward direction by a motor 62 provided above the outer frame 61.

A guide rail 64 is provided in front of the inner frame 63 in a horizontal direction (see a right side of FIG. 14). A needle 49A and an optical sensor 57 are fastened to a movable bench 65 with screws with a holder 50 interposed therebetween. The movable bench 65 is supported on the guide rail 64 so as to slide forward/rearward along the guide rail 64. Further, the movable bench 65 is driven by a screw shaft 67 rotated in a forward/backward direction by a pulse motor 66.

The needle 49A is formed into a comb shape including a plurality of needles. The needle 49A is coated with a non-viscous material. Preferably, the needle 49A has a width capable of receiving and holding a viscous face of a separating tape Ts. In this embodiment, the width of the needle 49A is wider than that of a separating tape Ts.

With reference to FIGS. 16 to 24, next, description will be given of an operation that the first separation unit 32A and a second separation unit 33 separate a protective tape PT from a wafer W.

First, a separation table 38 having a mount frame MT placed thereon moves forward to a portion located below the first separation unit 32A. Herein, the optical sensor 57 measures a change in intensity of a laser beam emitted therefrom downward in a vertical direction and reflected from a protective tape PT or a time difference of return time. On the basis of a result of the measurement, a controller 58 discriminates a surface height of the protective tape PT from a viscous face of a supporting viscous tape DT bared between a ring frame f and a wafer W Thus, a front end edge of the protective tape PT is detected.

Figure 16:
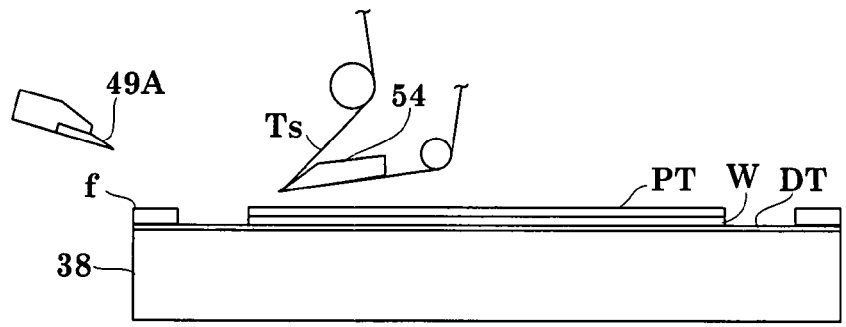
FIGS. 16 to 24 are side views each illustrating an operation of the separation mechanism according to the second embodiment.
Figure 17:
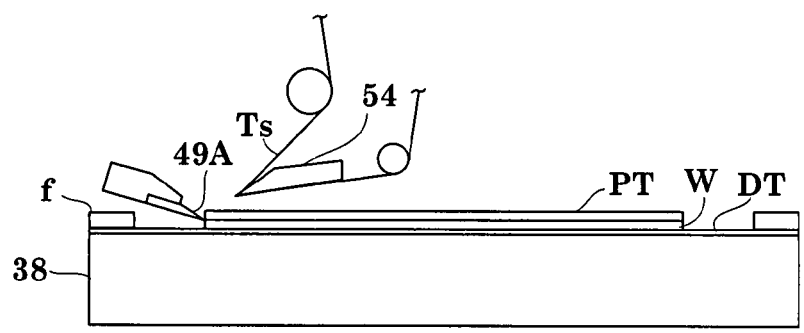

On the basis of a result of the detection, the controller 58 controls actuation of the pulse motor 66 so as to allow the movable bench 65 to move from the detected position toward a position located above an acting position where a tip end of the needle 49A is situated in the vicinity of a peripheral edge of the protective tape PT, as illustrated in FIG. 16. When the movable bench 65 arrives at the position located above the acting position, the controller 58 controls actuation of the motor 62 such that the inner frame 63 moves downward. More specifically, as illustrated in FIG. 17, the controller 58 allows the needle 49A to be situated at a height that the needle 49A is situated in the vicinity of a predetermined adhesion interface between the protective tape PT and the wafer W. The adhesion interface is previously defined as an acting position stuck with the tip end of the needle 49A. The position stuck with the tip end of the needle 49A is not limited to the adhesion interface, but may be a viscous layer of the protective tape PT. Accordingly, a height at which the inner frame 63 is situated is appropriately changed depending on a position of the protective tape PT stuck with the needle 49A.

Figure 18:
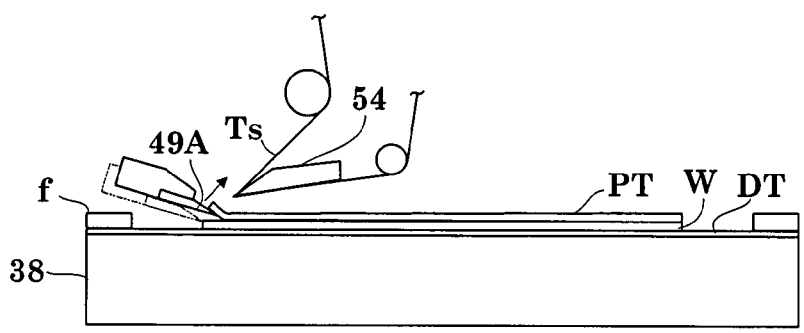

When the tip end of the needle 49A arrives at the acting position, the controller 58 controls the actuation of the pulse motor 66 and the motor 62. Then, as illustrated in FIG. 18, the movable bench 65 moves forward, the adhesion interface is stuck with the tip end of the needle 49A, and the peripheral edge of the protective tape PT is partially separated from the front face of the wafer W while the needle 49A is moved obliquely right-upward in FIG. 18. Thus, a separated portion is formed.

Figure 19:
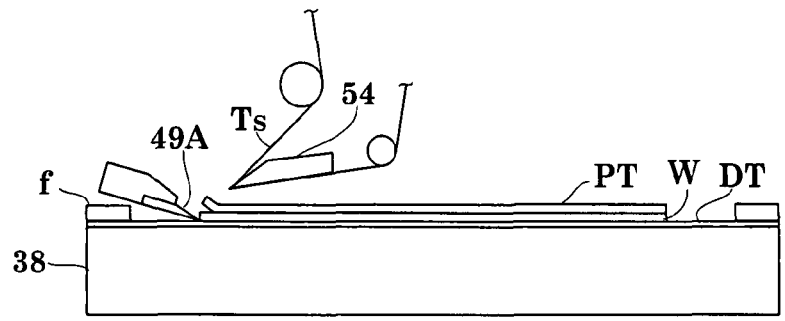

After the formation of the separated portion, the controller 58 controls the actuation of the pulse motor 66 such that the movable bench 65 retreats into a position where the tip end of the needle 49A is situated in the vicinity of an outer periphery of the wafer W. Then, the controller 58 controls the actuation of the motor 62 such that the inner frame 63 slightly moves downward. As illustrated in FIG. 19, the inner frame 63 is stopped when the tip end of the needle 49A is situated in a range from the adhesion interface between the wafer W and the supporting viscous tape DT to the surface height of the wafer W.

Figure 20:
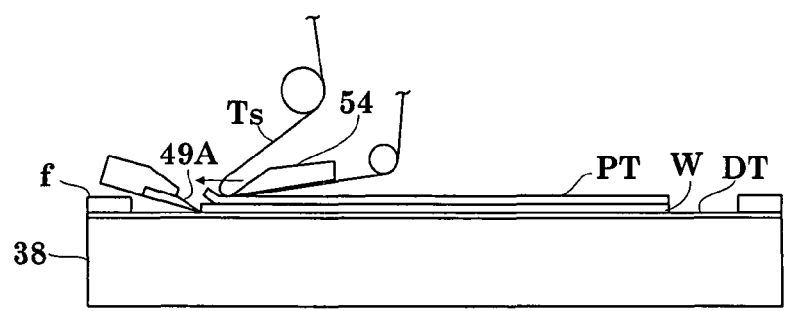
Figure 21:
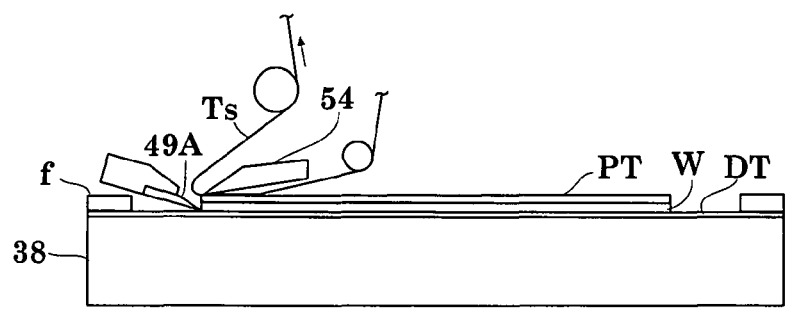

Thereafter, as illustrated in FIG. 20, the controller 58 allows an edge member 54 to move downward to a position inward the outer periphery of the wafer W. Herein, a separating tape Ts supplied from a tape supply section 31 is wound around the edge member 54. Then, as illustrated in FIG. 21, the separation table 38 retreats once, and the separating tape Ts is joined to the separated portion of the protective tape PT while a tip end of the edge member 54 presses the separating tape Ts against the separated portion of the protective tape PT by a predetermined pressing force.

Herein, if the separating tape Ts is unreeled excessively, protrudes from the outer periphery of the wafer W toward the tip end of the edge member 54 and drops onto the support adhesive tape DT, the tip end of the needle 49A situated in the vicinity of the outer periphery of the wafer W receives the dropped separating tape Ts. Moreover, since the needle 49A is coated with a non-viscous material, the separating tape Ts is not joined to the needle 49A.

Figure 22:
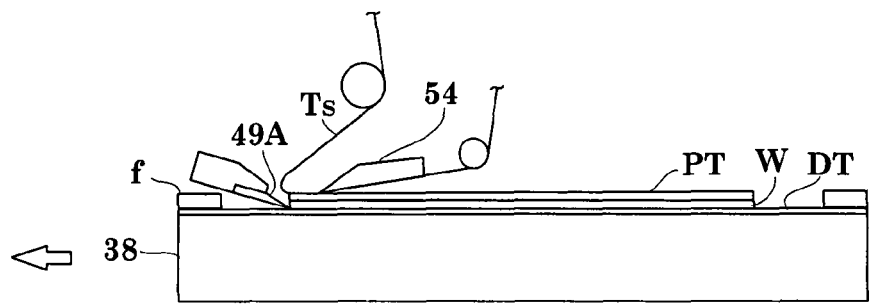
Figure 23:
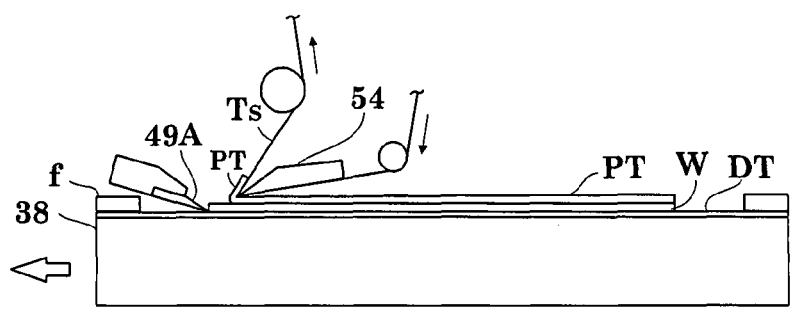
Figure 24:
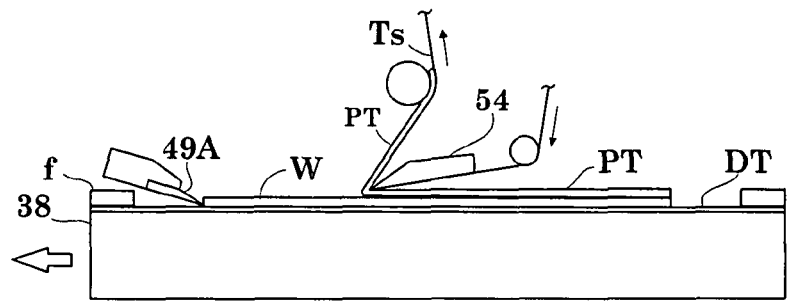

After performance of the operation of joining the separating tape Ts to the separated portion of the protective tape PT, as illustrated in FIGS. 22 to 24, the separation table 38 moves forward again (see a right side in the figure) in a state that the edge member 54 presses the separating tape Ts against the protective tape PT. Herein, a tape collection section 34 reels the separating tape Ts at a speed synchronous with a moving speed of the separation table 38. Thus, the edge member 54 joins the separating tape Ts to the protective tape PT joined to the front face of the wafer W while pressing the separating tape Ts against the protective tape PT. Concurrently, the edge member 54 separates the protective tape PT together with the separating tape Ts from the front face of the wafer W.

At the point in time that the pulse motor 43 is actuated such that the edge member 54 moves forward from the separating tape joining operation start position by a distance corresponding to the diameter of the wafer W, in other word, at the point in time that the edge member 54 arrives at a rear end edge of the protective tape PT and the protective tape PT is completely separated from the front face of the wafer W, the edge member 54 is moved upward and the second separation unit 33 returns to its initial position. Thus, the protective tape separating operation is completed.

As described above, a separated portion formed in such a manner that a peripheral edge of a protective tape PT is partially separated from a front face of a wafer W by the tip end of the needle 49A and, then, an operation of joining the separating tape Ts to a surface of the protective tape PT is started from the separated portion. Thus, the protective tape PT can be separated together with the separating tape Ts from the front face of the wafer W with certainty, with the separated portion as a starting point.

After the formation of the separated portion of the protective tape PT by the needle 49A, further, the tip end of the needle 49A is situated in the vicinity of the end of the separated portion, serving as a separation starting point, externally from the wafer W. Thus, even when the separating tape Ts unreeled excessively protrudes from the outer periphery of the wafer W and drops onto the supporting viscous tape DT, the needle 49A can receive the dropped separating tape Ts. In other words, it is possible to prevent a viscous face of the separating tape Ts from coming into contact with that of the supporting viscous tape DT. As a result, the wafer W is not applied with an excessive separating stress when the protective tape PT is separated therefrom. Thus, it is possible to prevent the wafer W from being damaged.

The present invention is not limited to the aforementioned embodiments, and may be modified variously as follows.

(1) In the first embodiment, when the movable block 47 is moved downward to the acting position, the tip end of the needle 49 is situated in the vicinity of a peripheral edge of a protective tape PT. Alternatively, the peripheral edge of the protective tape PT may be directly stuck with the needle 49. In this case, a length of the needle 49 is adjusted such that the tip end of the needle 49 penetrating through the protective tape PT does not come into contact with a front face of a wafer W. In the present invention, the number of the needle 49 is not limited to one, and a combination of a plurality of needles 49 may be used.

The needle 49 is provided at the lower end of the movable block 47 such that the tip end thereof is vertical to a surface of a protective tape PT. Alternatively, the needle 49 may be provided at a front side of the separation table 38 so as to be oblique to a moving direction of the separation table 38.

Also in the second embodiment, a surface of a protective tape PT may be stuck with the needle 49A such that the tip end of the needle 49A penetrating through the protective tape PT does not come into contact with a front face of a wafer W.

(2) In the first embodiment, a separated portion of a protective tape PT is formed by the needle 49 and, then, an operation of joining a separating tape Ts to the protective tape PT is started from the separated portion while a certain pressing force is applied to the separated portion. Preferably, the pressing force applied to the separated portion is made weaker than that applied to the other portion.

In this case, the controller 58 controls the actuation of the pulse motors 43 and 45 so as to control the motion of the separation table 38 and the height of the edge member 54 in a stepwise manner. More specifically, when the separation table 38 is moved by the distance L2 from a separated portion illustrated in FIG. 6, the height of the edge member 54 is made higher than that of a protective tape PT except the separated portion in order to weaken a pressing force applied to the separated portion. Then, after arrival at a terminal end of the separated portion, the separation table 38 is halted or is moved slowly and the edge member 54 is moved downward, so that the pressing force applied to the protective tape PT is increased. Thereafter, the separating tape Ts is joined to the protective tape PT with the increased pressing force applied to the protective tape PT. With this configuration, it is possible to prevent the separated portion from being joined to the front face of the wafer W again.

Also in the second embodiment, a pressing force applied to a separated portion is made weaker than that applied to the other portion of a protective tape PT.

(3) In the first and second embodiments, the edge member 54 is used as a joining member for a separating tape Ts. Alternatively, a roller may be used instead of the edge member 54. In this case, preferably, the roller has a hard circumferential face, and a diameter which is small as much as possible.

(4) In the first embodiment, the separation table 38 moves horizontally in a state that a peripheral edge of a protective tape PT is snagged on the needle 49. In order to separate a peripheral edge of a protective tape PT from a front face of wafer W, alternatively, the first separation unit 32 may be slightly moved upward at the point in time that the protective tape PT is snagged on the needle 49. Thus, the protective tape PT can be separated from the front face of the wafer W with more certainty because the peripheral edge of the protective tape PT is lifted up.

(5) In the first and second embodiments, the optical sensor 57 is used for detecting an end edge of a protective tape PT in a non-contact manner. Alternatively, an image captured by a CCD camera may be analyzed to detect the end edge of the protective tape PT.

(6) In the first and second embodiments, a mount frame MF may be allowed to be fixed and the first and second separation units 32 and 33 may be allowed to move horizontally.

(7) In the first embodiment, each of the needle 49 and the edge member 54 is movable downward. Alternatively, a mount frame MF may be allowed to move upward/downward with respect to the fixed needle 49 and the fixed edge member 54.

Also in the second embodiment, only the separation table 38 holding a mount frame MF may be allowed to move with respect to the fixed needle 49A and the fixed edge member 54.

(8) In the first and second embodiments, as an example, a separating tape Ts for separating a protective tape PT from a front face of a wafer W is of a strip shape and is prepared as a form of a roll. Alternatively, a stack of adhesive or viscous tapes each having an identical size may be used as the separating tape Ts. Further, an adhesive or viscous sheet may be used as the separating tape Ts.

(9) In the first and second embodiments, as an example, a protective tape PT is separated from a front face of a wafer W having a back face supported by a mount frame MF. Alternatively, the present invention may be applied to a case that a protective tape PT is separated from a front face of a wafer W which is not supported by a mount frame MF.

The present invention may be embodied in other specific forms without departing from the spirit or essential attributes thereof and, accordingly, reference should be made to the appended claims, rather than to the foregoing specification, as indicating the scope of the invention.

What is claimed is:

1. A method for joining a separating adhesive tape to a protective tape joined to a front face of a semiconductor wafer in such a manner that a joining member presses the separating adhesive tape against the protective tape to separate the protective tape together with the separating adhesive tape from the front face of the semiconductor wafer, the method comprising:

a first separation step of snagging a peripheral edge of the protective tape on a separation member having a sharp tip end so as to at least partially separate the peripheral edge of the protective tape from the front face of the semiconductor wafer;

a joining step of retreating the separation member by which the peripheral edge of the protective tape is separated from the front face of the semiconductor wafer, allowing the joining member to press the separating adhesive tape against the protective tape, and allowing the semiconductor wafer and the joining member to relatively move in a plane direction of the protective tape so as to join the separating adhesive tape to the protective tape; and a second separation step of allowing the semiconductor wafer and the joining member to relatively move in the plane direction of the protective tape with the separated peripheral edge as a starting point so as to separate the protective tape together with the separating adhesive tape from the front face of the semiconductor wafer;

the separation member being a needle.

2. The method of claim 1, wherein
in the joining step, a pressing force for joining the separating adhesive tape is made weak at the peripheral edge of the protective tape separated in the first separation step in comparison with the other portion of the protective tape.

3. The method of claim 1, wherein
the joining step and the second separation step are carried out concurrently.

4. The method of claim 1, wherein
in the first separation step, the semiconductor wafer and the separation member are relatively moved in the plane direction of the protective tape so as to be away from each other.

5. The method of claim 1, wherein
the joining member is an edge member having a sharp tip end.

6. A method for joining a separating adhesive tape to a protective tape joined to a front face of a semiconductor wafer in such a manner that a joining member presses the separating adhesive tape against the protective tape to separate the protective tape together with the separating adhesive tape from the front face of the semiconductor wafer, the method comprising:

a first separation step of sticking a separation member having a sharp tip end in a peripheral edge of the protective tape so as to partially separate the peripheral edge of the protective tape from the front face of the semiconductor wafer;

a joining step of retreating the separation member by which the peripheral edge of the protective tape is separated from the front face of the semiconductor wafer, allowing the joining member to press the separating adhesive tape against the protective tape, and allowing the semiconductor wafer and the joining member to relatively move in a plane direction of the protective tape so as to join the separating adhesive tape to the protective tape; and a second separation step of allowing the semiconductor wafer and the joining member to relatively move in the plane direction of the protective tape with the separated peripheral edge as a starting point so as to separate the protective tape together with the separating adhesive tape from the front face of the semiconductor wafer;

the separation member being a needle.

7. The method of claim 6, wherein
in the joining step, a pressing force for joining the separating adhesive tape is made weak at the peripheral edge of the protective tape separated in the first separation step in comparison with the other portion of the protective tape.

8. The method of claim 6, wherein
the joining step and the second separation step are carried out concurrently.

9. The method of claim 6, wherein
in the first separation step, the semiconductor wafer and the separation member are relatively moved in the plane direction of the protective tape so as to be away from each other.

10. The method of claim 6, wherein
the joining member is an edge member having a sharp tip end.

11. A method for joining a separating adhesive tape to a protective tape joined to a front face of a semiconductor wafer in such a manner that a joining member presses the separating adhesive tape against the protective tape to separate the protective tape together with the separating adhesive tape from the front face of the semiconductor wafer, the method comprising:

a first separation step of sticking a separation member having a sharp tip end in the protective tape so as to at least partially separate a peripheral edge of the protective tape from the front face of the semiconductor wafer;

a step of allowing the tip end of the separation member to be situated in the vicinity of the separated peripheral edge of the protective tape externally from a peripheral edge of the semiconductor wafer;

a joining step of allowing the joining member to start to press the separating adhesive tape against the protective tape from the separated peripheral edge of the protective tape, and allowing the semiconductor wafer and the joining member to relatively move in a plane direction of the protective tape so as to join the separating adhesive tape to the protective tape; and a second separation step of allowing the semiconductor wafer and the joining member to relatively move in the plane direction of the protective tape with the separated peripheral edge as a starting point so as to separate the protective tape together with the separating adhesive tape from the front face of the semiconductor wafer;

the separation member being a comb-shaped member including a plurality of needles.

12. The method of claim 11, wherein
in the joining step, a pressing force for joining the separating adhesive tape is made weak at the peripheral edge of the protective tape separated in the first separation step in comparison with the other portion of the protective tape.

13. The method of claim 11, wherein
the joining step and the second separation step are carried out concurrently.

14. The method of claim 11, wherein
in the first separation step, the semiconductor wafer and the separation member are relatively moved in the plane direction of the protective tape so as to be away from each other.

15. The method of claim 11, wherein
the joining member is an edge member having a sharp tip end.

* * * * *